United States Patent [19]
Kubo et al.

[11] Patent Number: 5,926,942
[45] Date of Patent: Jul. 27, 1999

[54] METHOD FOR MANUFACTURING SUPERCONDUCTING WIRE

[75] Inventors: Yoshio Kubo; Kunihiko Egawa; Hiroko Higuma; Takayuki Nagai; Fusaoki Uchikawa, all of Amagasaki, Japan

[73] Assignee: Mitsubishi Denki Kabushiki Kaisha, Tokyo, Japan

[21] Appl. No.: 08/832,796

[22] Filed: Apr. 4, 1997

Related U.S. Application Data

[62] Division of application No. 08/167,061, Dec. 16, 1993, Pat. No. 5,753,862.

[30] Foreign Application Priority Data

| Apr. 2, 1993 | [JP] | Japan | ................................. | 5-076841 |
| Aug. 5, 1993 | [JP] | Japan | ................................. | 5-194781 |
| Apr. 2, 1996 | [JP] | Japan | ................................. | 5-076837 |

[51] Int. Cl.$^6$ ............................................. H01L 39/24
[52] U.S. Cl. ....................... 29/599; 174/125.1; 505/821
[58] Field of Search ............................. 29/599; 505/821; 174/125.1

[56] References Cited

U.S. PATENT DOCUMENTS

| 3,710,000 | 1/1973 | Shattes et al. | ........................ | 29/599 X |
| 3,728,165 | 4/1973 | Howlett | ................................. | 29/599 X |

(List continued on next page.)

FOREIGN PATENT DOCUMENTS

| 0 498 413 | 8/1992 | European Pat. Off. . |
| 61-16141 | 4/1986 | Japan . |
| WO91/04583 | 4/1991 | WIPO . |

OTHER PUBLICATIONS

Y. Kubo et al., "Transactions of the Meeting," 49th Meeting on Cryogenics and Superconductivity, May 19–21, 1993, p. 187. (In Japanese).

E. Gregory et al, "The Development of an Internal–Tin Nb$_3$Sn Strand for Fusion Applications," Proceedings of the 17th Symposium on Fusion Technology, Rome, Italy, Sep. 18, 1992.

S. Miyashita et al, "Effects of the Titanium Addition to the NB$_3$Sn Wires Fabricated by the Internal Tin Diffusion Process," IEEE Transactions on Magnetics, vol. Mag–23, No. 2, Mar. 1987, pp. 629–632.

E. Gregory et al, "Improvement of the Structure and Properties of Internal Tin Nb$_3$Sn Conductors," Advances in Cryogenic Engineering, vol. 38, pp. 579–586.

Patent Abstracts of Japan, vol. 013, No. 005 (E–701), Jan. 9, 1989. JP 6321612.

Patent Abstracts of Japan, vol. 017, No. 097 (E–1326), Feb. 25, 1993, JP 04289615.

*Primary Examiner*—Carl J. Arbes
*Attorney, Agent, or Firm*—Burns, Doane, Swecker & Mathis, LLP

[57] ABSTRACT

A compound superconducting wire comprising a matrix of CuX alloy and a multiplicity of Z$_3$X filaments embedded in the matrix in a spaced relationship so as not to come into contact with each other wherein X is Sn or Ga and Z$_3$X is Nb$_3$Sn or V$_3$Ga. In a precursor, therefore, a multiplicity of filaments of a base metal material Z such as Nb are arranged in a Cu base metal matrix concentrically in layers around a center core of a base metal material X such as Sn, in which the spacing between any adjacent filaments arranged in a former boundary region of an ε-phase bronze layer having a certain radius from the center produced when the precursor is preheat-treated at a temperature of 300° to 600° C. is made larger than the spacing between any adjacent filaments arranged in the other matrix regions. Also disclosed is a precursor wire wherein a composite of a Cu base metal material and a base metal material X capable of forming an alloy with the Cu base metal material is used as a matrix without arranging a core of the base metal material X at the center, and a multiplicity of filaments of a base metal material Z are embedded in the composite in a spaced relationship.

32 Claims, 24 Drawing Sheets

U.S. PATENT DOCUMENTS

| | | |
|---|---|---|
| 3,763,553 | 10/1973 | Barber et al. . |
| 3,838,503 | 10/1974 | Suenaga ................................ 29/599 |
| 3,905,839 | 9/1975 | Hashimoto ......................... 29/599 X |
| 3,910,802 | 10/1975 | Wong ................................. 29/599 X |
| 3,930,903 | 1/1976 | Randall et al. ..................... 29/599 X |
| 3,954,572 | 5/1976 | Ziegler et al. ..................... 29/599 X |
| 3,958,327 | 5/1976 | Marancik et al. ...................... 29/599 |
| 3,996,661 | 12/1976 | Ziegler et al. ......................... 29/599 |
| 3,996,662 | 12/1976 | Hauck et al. .......................... 29/599 |
| 4,043,028 | 8/1977 | Koike et al. ........................... 29/599 |
| 4,055,887 | 11/1977 | Meyer ................................... 29/599 |
| 4,073,666 | 2/1978 | Marancik et al. .................. 29/599 X |
| 4,084,989 | 4/1978 | Meyer ............................... 29/599 X |
| 4,411,712 | 10/1983 | Marancik ........................... 29/599 X |
| 4,501,062 | 2/1985 | Hillmann ............................... 29/599 |
| 4,531,982 | 7/1985 | Dubots ............................... 29/599 X |
| 4,665,611 | 5/1987 | Sadakata et al. ....................... 29/599 |
| 4,687,883 | 8/1987 | Flükiger et al. . |
| 4,743,713 | 5/1988 | Scanlan . |
| 4,757,161 | 7/1988 | Wilhelm et al. . |
| 4,767,470 | 8/1988 | Tachikawa et al. ................ 29/599 X |
| 4,860,431 | 8/1989 | Marancik et al. ...................... 29/599 |
| 4,973,365 | 11/1990 | Ozeryansky et al. .............. 29/599 X |
| 4,990,411 | 2/1991 | Nakayama et al. ................ 29/599 X |
| 5,088,183 | 2/1992 | Kanithi .................................. 29/599 |
| 5,104,745 | 4/1992 | Cave et al. . |
| 5,139,893 | 8/1992 | Wong ................................. 29/599 X |
| 5,174,830 | 12/1992 | Wong et al. ....................... 29/599 X |
| 5,174,831 | 12/1992 | Wong et al. ....................... 29/599 X |
| 5,369,873 | 12/1994 | Walters et al. ........................ 29/599 |
| 5,419,974 | 5/1995 | Walters et al. .................... 29/599 X |
| 5,501,746 | 3/1996 | Egawa et al. ...................... 29/599 X |

F I G. 21
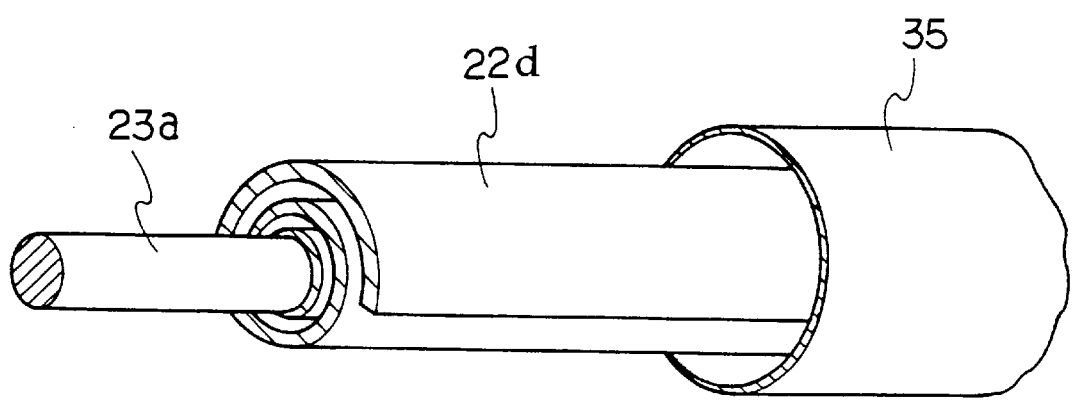

METHOD FOR MANUFACTURING SUPERCONDUCTING WIRE

This application is a divisional of application Ser. No. 08/167,061, filed Dec. 16, 1993, now U.S. Pat. No. 5,753,862.

BACKGROUND OF THE INVENTION

The present invention relates to a compound superconducting wire suitable for use in superconducting magnets of high magnetic field and a method for manufacturing the same. Particularly, the present invention is advantageously applicable to an Nb-Sn compound superconducting wire and a manufacturing method therefor.

The term "precursor of superconducting wire" or "superconducting wire precursor" as used herein means a wire prior to undergoing a heat treatment, i.e., a wire prior to being imparted with a superconductivity. The heat treated precursor to impart a superconductivity, namely the wire converted into superconductor by the heat treatment, is termed a "superconducting wire".

Hitherto, superconducting wires have been manufactured by a method so-called "internal diffusion method".

An $Nb_3Sn$ superconducting wire prepared by the internal tin diffusion method is known, for instance, from Japanese Patent Publication Kokoku No. 16141/1986. FIGS. 23 and 24 are explanatory sectional views respectively illustrating an $Nb_3Sn$ superconducting wire precursor prior to undergoing a heat treatment according to a conventional internal diffusion method described in Japanese Patent Publication Kokoku No. 16141/1986 and an $Nb_3Sn$ superconducting wire after undergoing the heat treatment. In FIG. 23, denoted at numeral 41 is the superconducting wire precursor prior to the heat treatment, at numeral 43 Nb base metal filaments to be converted into a superconductor by the heat treatment, at numeral 44 barrier layer such as made of Ta, at numeral 45 stabilizing layer such as made of oxygen free copper, at numeral 46 Cu base metal material, and at numeral 47 Sn base metal material. In FIG. 24, denoted at numeral 48 is the superconducting wire after the heat treatment, at numeral 49 $Nb_3Sn$ filaments having a superconductivity, and at numeral 50 low-Sn-concentration bronze.

The superconducting wire 48 is obtained by subjecting the superconducting wire precursor 41 to a heat treatment at a high temperature (typically ranging from 600° to 800° C.) to produce an $Nb_3Sn$ compound in the Nb filaments 43.

The conventional method for manufacturing an $Nb_3Sn$ superconducting wire using the internal diffusion method is as follows. First, an Nb base metal material is inserted into a Cu tube and processed to decrease the area in section to a certain diameter thereby giving a single core wire. This single core wire is cut into pieces having an appropriate length and a plurality of these wire pieces are stuffed into a container made of Cu. In the center portion of this container is disposed a Cu base metal material such as a Cu rod or a bundle of Cu wires. Air in the container is evacuated, a cover is welded to the container to seal it up, and the thus treated container is extruded. Thereafter the Cu base metal material in the center portion of the container is mechanically formed with an aperture. An Sn base metal material is inserted into this aperture, and the Cu container is circumferentially covered with a tube made of Ta or Nb, which is further covered with a Cu tube. The resultant is processed to reduce the cross-sectional area, typically is drawn to a small size. When it is desired to produce a superconducting wire having a heavy current capacity, a plurality of the thus obtained composite wires may be inserted into a Cu tube and then drawn to reduce the section area. After drawing the wire to a final diameter, it is twisted and subjected to a heat treatment. This heat treatment causes Sn to diffuse into Cu existing therearound to form Cu-Sn alloy and further to react with the Nb base metal filament to produce $Nb_3Sn$ either partially or entirely.

The superconducting wire precursor in the aforesaid internal diffusion method has a structure in which the Nb base metal filaments and a core of the Sn base metal material are embedded in the Cu base metal material. In particular, in order to increase as large as possible the critical current density (Jc) which is one of the characteristics of superconductivity, the Nb base metal filaments are embedded in the Cu base metal material as tightly as possible. The superconducting wire when cooled to the temperature of liquid helium is capable of allowing heavy current to flow therein without producing any electrical resistance.

As described above, in the compound superconducting wire manufactured by the prior art internal diffusion method the Sn base metal material is disposed at the center of the module and, hence, the space between adjacent $Nb_3Sn$ filaments is as narrow as about a half of the spacing between such filaments arranged in accordance with a usual bronze method. For this reason the Nb base metal filaments tend to come into contact with each other to combine to each other when the superconducting wire precursor is heat-treated, thus resulting in increase of the effective filament diameter ($d_{eff}$), which greatly influences the electrical characteristics of the superconducting wire. The effective filament diameter is a value given by $d_{eff}=3\pi\Delta M/4\mu_o Jc$ where the sample is in the columnar form, $\Delta M$ represents the width of magnetization of the superconducting wire, and Jc represents the critical current density in these conditions. As a result, a problem arises that although the resulting superconducting wire suffers no problem with respect to DC current, it suffers a large hysteresis loss when pulse current is made to flow therein with the result that the superconducting coil generates heat to degrade the stability thereof.

Further, since the Sn base metal material is centrally disposed in the internal diffusion method, preheating for Sn diffusion produces a gradient in Sn concentration. Accordingly, the composition of the $Nb_3Sn$ filaments varies depending on the Sn concentration. This poses another problem that the n value, which is one of the characteristics of superconductivity, is undesirably decreased. The n value is an index representing the longitudinal homogeneity of a superconducting wire and appears in the formula, $V\ I^n$. The superconducting characteristics of the wire become more excellent with increasing n value.

It is, therefore, a primary object of the present invention to provide a compound superconducting wire wherein the effective filament diameter thereof is decreased to a large extent with minimizing the decrease in the critical current density Jc thereof, and the n value is increased.

A further object of the present invention is to provide a process for producing a superconducting wire, especially an Nb-Sn compound superconducting wire, having a high critical current density Jc, an improved effective filament diameter and an improved uniformity in composition of superconductive compounds in the longitudinal direction of wire.

A still further object of the present invention is to provide an improved internal diffusion process for producing a superconducting wire which enables to prevent filaments of a metal to be converted into a superconductive compound from contacting each other during the heat treatment without decreasing the number of the filaments arranged in a matrix metal.

Another object of the present invention is to provide a precursor of compound superconducting wire which can provide a superconducting wire having an improved critical current density Jc, a decreased hysteresis loss and an improved uniformity in composition of superconductive compound by a heat treatment in a shortened period of time.

These and other objects of the present invention will become apparent from the description hereinafter.

SUMMARY OF THE INVENTION

In a superconducting wire precursor when heat-treated, an Sn base metal material disposed at the center portion of the precursor wire is diffused into a Cu base metal material during the heat treatment and reacts therewith to produce a bronze, and an $\epsilon$-phase bronze is formed within a certain radius from the center in a certain temperature range.

The present inventors have found that the phenomenon that $Nb_3Sn$ filaments of a superconducting wire come into mutual contact, as encountered in heat-treating the precursor wire, appears particularly in an $\epsilon$-phase boundary (outer periphery of $\epsilon$-phase bronze layer) region, namely a region having a certain width in the radial direction in which the boundary of the $\epsilon$-phase bronze locates, and the above objects can be achieved by preventing the $Nb_3Sn$ filaments from contacting each other in this region.

In accordance with a first aspect of the present invention, there is provided an Nb-Sn compound superconducting wire comprising a matrix of a bronze having a low Sn concentration and a multiplicity of $Nb_3Sn$ filaments arranged in said matrix, wherein a center portion of the superconducting wire is formed of only said bronze, and said $Nb_3Sn$ filaments are concentrically outwardly arranged in layers around said center portion separately from each other, and wherein the spacing between any adjacent $Nb_3Sn$ filaments disposed in a boundary region of an $\epsilon$-phase bronze layer produced when pre-heated at a temperature of 300° to 600° C. is larger than that between any adjacent $Nb_3Sn$ filaments disposed in the other matrix portions.

The aforesaid Nb-Sn compound superconducting wire is prepared by a process which comprises the steps of:

(a) forming a composite body comprising a columnar Cu base metal material, and a multiplicity of Nb base metal filaments embedded separately from each other in the Cu base metal material and concentrically arranged in layers around a center portion thereof in such a relationship that the spacing between any adjacent Nb base metal filaments existing in a boundary region of an $\epsilon$-phase bronze layer produced when preheated at a temperature of from 300° to 600° C. is larger than that between any adjacent Nb base metal filaments existing in the other portions of the Cu base metal material;

(b) forming a through-hole in said center portion, typically in such a manner as subjecting the composite body to extrusion processing and then drilling the center portion of the extrudate, or in such a manner as extruding the composite body into a tubular shape; and then inserting an Sn base metal rod into the through-hole;

(c) drawing the resultant composite body to form a superconducting wire precursor; and (d) heat-treating the precursor.

The heat-treatment of the precursor makes Sn to diffuse from the Sn rod arranged in the center portion of the precursor into Cu to produce a matrix of a Cu-Sn bronze having a low concentration of Sn and to convert the Nb filaments into $Nb_3Sn$ filaments. In the thus obtained Nb-Sn compound superconducting wire according to the present invention, the center portion corresponding to the Sn rod-inserted portion of the precursor is made of only the low Sn concentration bronze, in other words, no $Nb_3Sn$ filament is present at the center portion. The bronze matrix comprises an outer low Sn concentration bronze region, an inner low Sn concentration bronze region, and an annular $\epsilon$-phase bronze boundary region which is located between the outer and inner regions and in which the boundary of the $\epsilon$-phase bronze produced at a temperature of 300° to 600° C. and converted into $\alpha$-phase bronze at a higher temperature appears and the $Nb_3Sn$ superconductor filaments are arranged with a larger spacing as compared to the arrangement in the other matrix regions.

According to the above-mentioned process, a superconducting wire is obtained in the state that the $Nb_3Sn$ filaments are not in contact with each other. Accordingly, the superconducting filaments are prevented from mutually coupling while minimizing a reduction in Jc value, so that the effective filament diameter value is reduced. As a result, there is achieved a marked reduction in hysteresis loss upon conduction of pulse current, leading to improvement in stability of a superconducting coil.

The mutual contact of the $Nb_3Sn$ filaments which is considered owing to expansion, movement or swaying of filaments during the heat treatment of the precursor wire can also be decreased by not arranging the filaments in the inside of the boundary of the $\epsilon$-phase bronze layer. Accordingly, even if the spacing between the any adjacent filaments arranged in the boundary region of the $\epsilon$-phase bronze layer is not increased, it is possible to provide an improved $Nb_3Sn$ superconducting wire by arranging the $Nb_3Sn$ filaments in the same manner as in a conventional internal diffusion method except that the filaments are not arranged in the inside of the boundary of the $\epsilon$-phase bronze layer.

It has also been found that the Sn diffusion in the heat treatment step can be efficiently achieved to form a Cu-Sn alloy as a matrix and to convert Nb filaments into $Nb_3Sn$ filaments by using a Cu-Sn composite material as a matrix for Nb filaments instead of arranging an Sn rod in the center portion of the precursor. Thus, the spacing between adjacent Nb filaments can be increased without decreasing the number of Nb filaments to be arranged, and the Nb filaments can be prevented from contacting each other in the heat treatment of the precursor.

Thus, the present invention further relates to a superconducting wire, its precursor and a method for manufacturing the superconducting wire, wherein the problems associated with the $\epsilon$-phase boundary are solved by disposing composite bodies of a Cu base metal material and an Sn base metal material in the overall module without disposing the Sn base metal material in the center portion of the module.

This technique is also advantageously applicable to the preparation of other compound type superconducting wires, e.g., $V_3Ga$, $Nb_3Al$ and $V_3Si$.

Accordingly, in accordance with the second aspect of the present invention, there is provided a compound superconducting wire precursor comprising a composite composed of a Cu base metal material and a first base metal material X capable of forming an alloy with the Cu base metal material, and a multiplicity of filaments of a second base metal material Z which are provided within the composite so as not to come into mutual contact.

The compound superconducting wire according to the second aspect of the present invention is obtained by heat-treating the aforesaid superconducting wire precursor, and thereby converting the filaments of the second base metal material Z into $Z_3X$ filaments and forming a Cu-X alloy as the matrix for the $Z_3X$ filaments.

According to the second aspect of the present invention, the superconducting wire is prepared by a process comprising the steps of:

(A) forming a composite rod in which a mulitplicity of rods of a second base metal material Z are embedded in a composite body composed of a Cu base metal material and a first base metal material X capable of forming an alloy in combination with the Cu base metal material;

(B) drawing the composite rod to form a superconducting wire precursor; and (C) heat-treating the superconducting wire precursor.

In the compound superconducting wire precursor according to the second aspect of the present invention, since the first base metal material X such as Sn or Ga is dispersedly arranged, there is no need to provide a first base metal core such as Sn or Ga in the central portion of the precursor wire as conducted in a known internal diffusion process and, hence, the area capable of being provided with filaments is increased by the area of the central portion. This makes it possible to enlarge the spacing between adjacent filaments by about 30% as compared with that according to a conventional internal diffusion method. Consequently there is achieved a remarkable reduction in the probability of mutual contact between superconducting filaments in the superconducting wire obtained by the heat treatment of the precursor, resulting in a substantial reduction in the effective filament diameter value. This leads to a substantial reduction in hysteresis loss caused upon conduction of pulse current and, hence, contributes to realization of a superconducting coil having an improved stability.

In addition, the distance of diffusion of the first base metal X such as Sn or Ga is shortened to assure a uniform content of Sn or Ga after the diffusion. As a result, the composition of the $Nb_3Sn$ filaments or the like to be produced is made homogeneous thereby improving the n value which is one of the characteristics of superconductivity. Further the preheating time required for diffusion of the first base metal X can be shortened, which leads to a reduction in cost.

BRIEF DESCRIPTION OF THE DRAWINGS

FIG. 21 is an explanatory view showing another embodiment of a composite single core wire for use in manufacturing a superconducting wire precursor according to the second aspect of the present invention;

DETAILED DESCRIPTION

Figure 1:
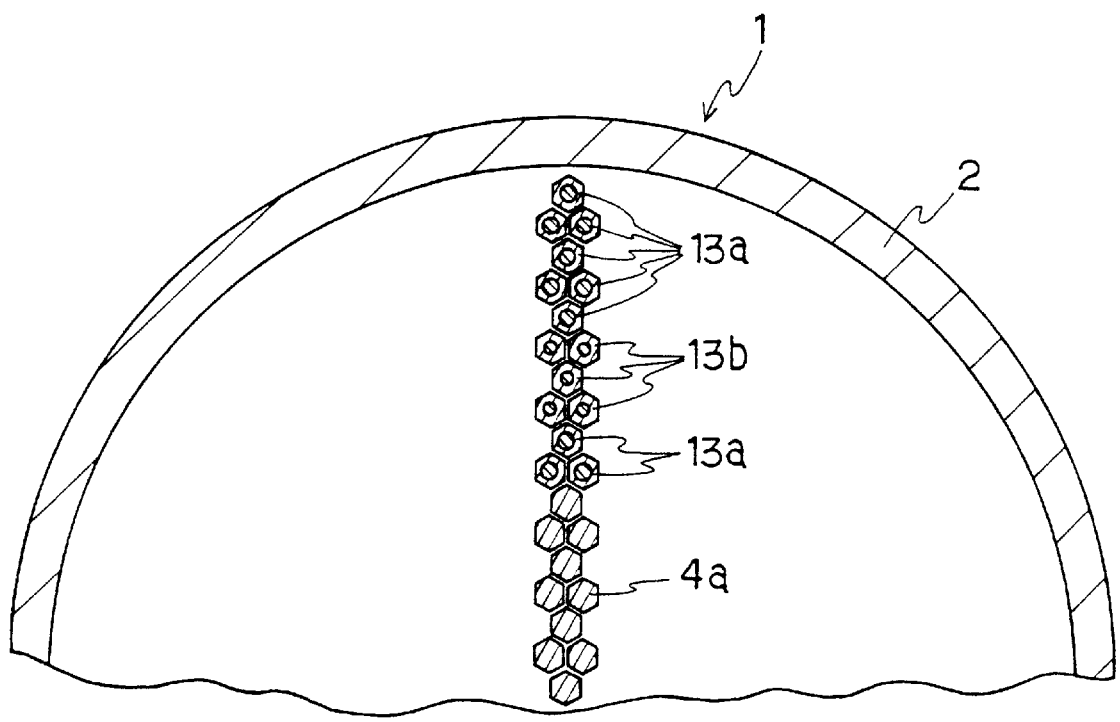
FIG. 1 is an explanatory section view showing a composite body prior to undergoing extrusion in an embodiment of a superconducting wire according to a first aspect of the present invention.

In the following description on a superconducting wire and a precursor thereof, a case where Nb and Sn are used will be explained for convenience. However, it should be understood that Nb and Sn can be replaced with other metals Z and X, for example, V and Ga, respectively, and that a superconducting wire using a compound other than $Nb_3Sn$ produces substantially the same effects as a superconducting wire using $Nb_3Sn$. Among compounds other than $Nb_3Sn$, $V_3Ga$ is particularly practical.

The term like "A base metal . . ." or "base metal material A" as used herein means to include any metal mainly composed of a metal A which may either be a pure metal A or contain an additive. The expression like "A base metal . . ." or " base metal material A" is employed because the metal A as a base metal may form an alloy or an intermetallic compound in combination with another metal.

The first aspect of the present invention will be described in detail.

The Nb-Sn superconducting wire according to the first aspect of the present invention has $Nb_3Sn$ filaments embedded in a bronze layer with such a space between adjacent filaments as not to cause their mutual contact or coupling. To assure such a space between adjacent $Nb_3Sn$ filaments while allowing $Nb_3Sn$ filaments as many as possible to be embedded, the precursor is prepared in such a manner that the space between adjacent Nb base metal filaments is made larger in a region in which Nb base metal filaments are easy to come into contact with each other in the heat treatment step, namely a boundary region of an $\epsilon$-phase bronze layer produced when preheated at a temperature of 300° to 600° C., than in other regions. The superconducting wire precursor having such an arrangement of the Nb filaments is heat-treated.

The preheating is performed, before the heat treatment for turning the superconducting wire precursor into a superconducting wire, at a temperature of 300° to 600° C. for diffusing an Sn base metal material located in the center portion of the precursor into a surrounding Cu base metal material to form a bronze matrix of a Cu-Sn alloy. The preheating is followed by the heat treatment.

The Nb-Sn superconducting wire is obtained by the so-called "internal diffusion method". For instance, it is prepared as follows: Single core wires or filaments obtained by drawing Nb base metal rods or filaments each covered with the Cu base metal material are stuffed in a billet, preferably in a concentrical multi-layer arrangement, and the resultant is extruded to form a composite body. Alternatively, Cu plates each formed with apertures are laid on top of another to form a block body having apertures arranged concentrically in layers in the section thereof, Nb base metal rods or Nb single core wires are inserted into the apertures, respectively, and then the resultant is extruded to form a composite body. Thereafter, an aperture is formed in the center portion of the composite body and then inserted with an Sn base metal rod, and the resultant is drawn to form a superconducting wire precursor. Finally the precursor is subjected to a heat treatment at a temperature of 300° to 600° C. for a time sufficient to produce bronze and then at a temperature of 600° to 800° C. for 100 to 200 hours to form the superconducting wire. The superconducting wire precursor can also be obtained in such a manner that a tubular composite body is formed by tubular extrusion or cold forming of a billet filled with single core wires, an Sn base metal rod is inserted in the central portion of the tubular composite body, and then the resultant is drawn to form a superconducting wire precursor. The Nb base metal filaments in the Cu base metal material are converted into $Nb_3Sn$ filaments either partially or completely by the heat treatment of the precursor, thus the superconducting wire is obtained in which the $Nb_3Sn$ filaments are embedded in the Cu base metal material, typically a Cu-Sn bronze matrix.

In the superconducting wire according to the first aspect of the present invention, the spacing between adjacent $Nb_3Sn$ filaments is made larger in the boundary region of an $\epsilon$-phase bronze layer produced by the reaction occurring in the heat treatment between the Sn base metal centrally located and the Cu base metal material than in the other regions by making each filament thin or arranging the filaments sparsely in the boundary region, whereby the $Nb_3Sn$ filaments in this region are prevented from their mutual contact. Hence, the superconducting wire offers excellent electrical characteristics from the viewpoint of hysteresis loss.

The $\epsilon$-phase bronze layer is one of the phases of Cu-Sn alloy produced in a heating temperature range of 300° to 600° C. upon the heat treatment for causing the centrally-located Sn base metal material to diffuse into the Cu base metal material to form bronze, and means an intermetallic compound represented by $Cu_3Sn$. The $\epsilon$-phase bronze is rigid and brittle as compared with $\alpha$-phase bronze. In the heat treatment at a temperature of 600° to 800° C., the $\epsilon$-phase once produced disappears because of creation of $Nb_3Sn$. The $\epsilon$-phase is formed outwardly from the center. The boundary between the $\epsilon$-phase bronze and the Cu base metal material usually appears at the position spaced apart from the center by a distance about 50% to about 70% of the radius of the superconducting wire precursor (or of the radius of the circle inside a barrier layer if provided), namely a distance about 50% to about 70% of the radius of the matrix wherein filaments are embedded, though the distance varies depending on the amount of Sn. For instance, the boundary of the $\epsilon$-phase bronze layer produced when the superconducting wire precursor is heated at 415° C. appears at a distance of 50 to 70% of the radius of the superconducting wire precursor from the center thereof. The heat treatment at a temperature of 600° C. or higher causes the $\epsilon$-phase inside the circular boundary to convert into $\beta$, $\gamma$-phase, which in turn expands over sustantiantially the entire section to finally form the $\alpha$-phase bronze matrix.

The reason why the $Nb_3Sn$ filaments tends to come into mutual contact when the superconducting wire precursor is heat-treated has not been made clear, but can be assumed that chances of their mutual contact are increased because the volume of each Nb base metal filament is increased by about 30% when it turns into the $Nb_3Sn$ filament, the filaments are likely to move during the heating, or a like phenomenon occurs. The movement of the filaments is particularly conspicuous in the boundary region of the $\epsilon$-phase bronze layer.

To avoid mutual contact of the $Nb_3Sn$ filaments in the $\epsilon$-phase bronze layer boundary region, the spacing between adjacent Nb base metal filaments in the precursor prior to the heat treatment thereof is preferably at least 0.45 times the diameter of each Nb base metal filament, especially 0.48 times or more. When the spacing, which is found experimentally, is less than the above value, many mutual contacts of the filaments are likely to occur though the Jc value of the superconducting wire obtained by the heat treatment is expected to increase. Consequently the resulting superconducting wire suffers an increased $d_{eff}$ or AC loss and is, therefore, unsuitable for use as a superconducting wire for pulse current. If the spacing is, for example, 0.38 times the diameter of the Nb filament, the $d_{eff}$ value assumes 500 $\mu$m, resulting in a wire unusable as the superconducting wire for pulse current.

The region in which the spacing between adjacent Nb base metal filaments needs to be enlarged is a region near the boundary of the ε-phase bronze layer produced when heat-treated, preferably a region defined between circles having radiuses of 0.7 time and 1.4 times the distance from the center of the precursor to the boundary of the ε-phase bronze layer produced when the precursor is heated at 415° C., especially a region between. 0.9 time and 1.2 times the radius of the circular ε-phase bronze layer. If the spacing between adjacent filaments is enlarged in a region beyond this range, the number of Nb base metal material is decreased and, as a result, the Jc value of the superconducting wire finally obtained is undesirably decreased. The distance between the center and the boundary can be found from a photograph of a polished section of the superconducting wire taken by using an optical microscope or electron microscope.

The superconducting wire precursor according to the first aspect of the present invention is prepared by, for example, the following methods.

(1) There are prepared two types of single core wires each of which an Nb wire is embedded centrally of a Cu base metal material and which have different Cu wall thicknesses. In the center portion of a Cu billet is inserted a Cu base metal rod, and the single core wires are stuffed around the center Cu rod. At this time, the aforesaid single core wires having a thick Cu wall are arranged in the region corresponding to the boundary region of the ε-phase bronze layer produced in the heat treatment for obtaining a superconducting wire, while single core wires having a thin Cu wall are arranged in the regions located in the inside and outside of the annulus defined by such a region, or in only the region located in the outside of the annular boundary region.

The aforesaid two types of single core wires are formed by inserting Nb rods having the same thickness into two sorts of Cu pipes different in wall thickness, respectively and drawing the resultants.

In this case, if the two types of the Cu pipes inserted with Nb wires are drawn so as to have the same diameter (if the section is polygon, the diameter is meant by the distance across flats), the Nb wire in the obtained core wire having a larger Cu wall thickness becomes thinner than in other type of single core wire. Accordingly, when the single core wires of the type having larger Cu wall thickness are arranged in the boundary region of the ε-phase bronze layer while arranging the single core wires of the other type in other regions, the spacing between adjacent Nb base metal filaments in the boundary region of the ε-phase bronze layer is made larger than in other regions.

Alternatively, if the two types of the Cu pipes inserted with the Nb wires are drawn so that the Cu-thick type wires would have a larger diameter than the Cu-thin type wires, or drawn in the same drawing ratio, the spacing between adjacent Nb base metal filaments in the portion filled with the Cu-thick type single core wires can be made larger, depending on the Cu thickness, than the spacing in the portion filled with the other type single core wires.

Consequently, in either case, the spacing between adjacent Nb base metal filaments can be made larger in such a manner.

Thereafter, the Cu billet stuffed with the aforesaid single core wires and the Cu base metal rod or rods is subjected to an elongation process, e.g., extrusion, to form a composite body, an aperture is formed in the central Cu rod portion, and an Sn base metal rod is inserted into the aperture.

Instead of forming an aperture in the center portion of the composite body, such a Cu billet may be formed into a tubular composite body by a tubular extrusion, cold forming or a like technique, which is then inserted with the Sn base metal material in its hollow portion.

Thereafter, the composite body is, as occasion demands, covered with a barrier material against Sn diffusion, for example, Ta, and further with a stabilizing material, and is drawn to form the superconducting wire precursor. The precursor is then subjected to a preheating at a temperature of 300° to 600° C. to diffuse the centrally-located Sn base metal material into the Cu base metal surrounding each Nb filament, thereby producing bronze. Further, the resultant is subjected to a heat treatment at a temperature of 600° to 800° C. to provide the superconducting wire.

The aforesaid stabilizing material may be provided for forming a layer which will not be turned into bronze even by the heat treatment. In general the stabilizing layer is provided as the outermost layer, but its location is not limited to the outermost portion of the wire and it may be provided in the inner portion of the superconducting wire. The provision of the stabilizing material layer allows to obtain a superconducting wire which is more stable against electrical and thermal treatments. The stabilizing material includes Cu, Al having high purity, or the like. To avoid such bronzing, it is advantageous that a barrier layer for blocking Sn diffusion is provided usually between the Sn-Cu composite body and the stabilizing layer. The material for the barrier layer is preferably Ta, but Nb, V or the like is also usable.

(2) In stuffing the single core wires into the Cu billet, the region inside the ε-phase bronze layer boundary is stuffed with Cu base metal material rods or wires solely, the region immediately outside the boundary is stuffed with the single core wires having a thick Cu wall in at least one layer while the further outer region with single core wires having a thin Cu wall. Thereafter, the resultant is processed in a manner similar to that in the method (1).

(3) Oxygen-free copper disk plates each having a multiplicity of apertures are stuffed in a stacked fashion in the Cu billet, and then Nb rods or wires are inserted into the apertures. The location of apertures in the oxygen-free copper disk corresponds to that of the single core wires stuffed in the case of the method (1). The spacing between adjacent apertures in the region corresponding to the ε-phase bronze layer boundary region is made larger than in the other regions. Thereafter, the processing is conducted in a manner similar to that in method (1).

The outer surface of the composite body as obtained in the above methods may in advance be plated with Sn so as to reduce the amount of Sn to be provided in the center portion.

In order to provide a superconducting wire having a heavy current capacity, a plurality of the thus obtained precursor wires may be packed in a Cu pipe and drawn to give a multi-module precursor wire.

In the superconducting wire according to the first aspect of the present invention, like that according to the second aspect to be described later, the $Nb_3Sn$ filament may contain as a trace element 0.01 to 5% by weight of at least one element selected from the group consisting of Ti, Ta, Hf, In, Ge, Si, Ga, Mo, Zr, V and Mn. Effects obtained by the inclusion of such a trace element are the same for both the first and second aspects of the invention.

$Nb_3Sn$ containing a trace amount of the above element is obtained by the following methods.

(i) Employed is an Sn alloy containing 0.01 to 10% by weight of at least one element selected from the group consisting of Ti, In, Ga, Ge, Si and Mn, or an Sn molding formed from a metal powder mixture containing 0.01 to 10% by weight of at least one of these metals. If the amount of the trace element is less than 0.01% by weight, any effect cannot be recognized, while, on the other side, if it exceeds 10% by weight, the amount of Sn to be supplied is decreased thereby decreasing the amount of $Nb_3Sn$ to be produced, resulting in a superconducting wire of degraded characteristics.

(ii) Employed is an Nb alloy containing 0.01 to 5% by weight of at least one element selected from the group consisting of. Ti, Ta, Hf, Mo, Zr and V, or an Nb molded product formed from a metal powder mixture containing 0.01 to 5% by weight of at least one of these metals. If the amount of the trace element to be added is less than 0.01% by weight, any effect cannot be recognized, while, on the other side, if it exceeds 5% by weight, the amount of Nb to be supplied is decreased thereby decreasing the amount of $Nb_3Sn$ to be produced, resulting in a superconducting wire of degraded characteristics.

(iii) Employed is Cu containing 0.01 to 5% by weight of at least one element selected from the group consisting of Ti, In, Ge, Si and Mn. If the amount of the trace element to be added is less than 0.01% by weight, any effect cannot be expected, while, on the other side, if it exceeds 5% by weight, the processability is remarkably decreased. The processability can be enhanced by incorporating 0.01 to 1% by weight of Sn in the Cu base metal material.

The mutual contact of the $Nb_3Sn$ filaments can be decreased by not arranging the filaments in the inside of the boundary of the $\epsilon$-phase bronze layer with or without increasing the spacing between any adjacent filaments arranged in the boundary region of the $\epsilon$-phase bronze layer. Accordingly, in another embodiment of the present invention, Nb-Sn compound superconducting wires having improved characteristics are obtained by arranging Nb base metal filaments separately from each other in a continuous phase of a Cu base metal material, in the center portion of which an Sn base metal material is arranged, according to a conventional internal diffusion method so that the Nb base metal filaments are present only in the outside of the boundary of the $\epsilon$-phase bronze layer, and then drawing the resultant to form a precursor wire and heat-treating the precursor wire. In the thus prepared precursor wire, when the spacing between any adjacent Nb base metal filaments located in the boundary region of the $\epsilon$-phase bronze layer is made larger than the spacing in the other portion in the manner described above, further improved superconducting wires are obtained.

The superconducting wire precursor according to the second aspect of the present invention is obtained by the following methods.

(I) Cu base metal plates and Sn base metal plates are alternately stacked and then rolled to form an integrally-formed Cu-Sn composite body. The resulting composite body is stuffed in an oxygen-free copper container along the length thereof, and the resultant is extruded to form a Cu-Sn composite rod. A plurality of apertures are formed in the composite rod in the longitudinal direction thereof, Nb base metal rods are inserted into the respective apertures, and then the resultant is drawn.

(II) A multiplicity of composite single core wires each obtained by covering an Nb base metal rod with a composite of Cu and Sn are tightly stuffed in an oxygen-free copper container, and then this container is drawn.

Preferably, the container prior to the drawing is covered with a barrier material against Sn and further with a pipe of a stabilizing material, as occasion demands, followed by drawing. However, it is not always necessary to provide the stabilizing layer as the outermost layer, and it may be arranged in a desired location according to design of the wire. There is preferred a superconducting wire precursor having a stabilizing layer of Cu or Al free of Sn. The barrier material is those capable of preventing Sn diffused during the heat treatment from reaching the layer of the stabilizing material.

The proportion of Sn in the aforesaid composite of Cu and Sn is from 1 to 99% by weight, preferably 13 to 20% by weight. The amount of Sn smaller than 1% by weight is insufficient and thus a sufficient amount of $Nb_3Sn$ is difficult to produce. When the amount of Sn exceeds 99% by weight, the volume rate of Sn is increased too much, thus rendering the composite too soft to be processed.

The aforesaid composite single core wire used in method (II) is prepared by the following methods.

(a) An Nb base metal rod is inserted into a Cu base metal pipe, the resultant is extruded to form a single core wire, and the outer surface of the single core wire is plated with Sn to form the composite single core wire.

(b) A plurality of apertures are formed in the wall of a tubular oxygen-free copper container in the longitudinal direction, and into each of the apertures are inserted Sn rods. An Nb base metal rod is inserted into the central portion of the container, followed by extrusion to form the composite single core wire.

(c) An Sn plate is sandwiched between two Cu plates and the resultant is rolled to form an integrated Cu-Sn composite plate. Otherwise, a Cu plate is plated with Sn on at least one side thereof. The Cu-Sn composite plate or Sn-plated Cu plate is wrapped around an Nb base metal rod several times, and the resultant is extruded to form the composite single core wire.

In the superconducting wire precursor according to the second aspect of the present invention, the spacing between adjacent Nb base metal filaments needs to be 14/100 or more, especially 30/100 or more, of the diameter of a single filament so as to avoid mutual contact thereof. However, if the spacing is too large, the number of $Nb_3Sn$ filaments accommodated in the superconducting wire is undesirably reduced, resulting in a decreased Jc value. On the other hand, too small spacing causes the $d_{eff}$ value to increase. Therefore, it is desirable that the spacing between adjacent filaments is larger than the above value but as small as possible.

The superconducting wire according to the second aspect of the present invention is obtained by preheating the superconducting wire precursor at a temperature ranging from 200° to 600° C. for an appropriately selected time period to convert the Cu-Sn composite into bronze, then heating it at a temperature of 600° to 800° C. for about 100 to 200 hours to convert the Nb base metal filaments into $Nb_3Sn$ filaments. The heat treatment at a temperature of 600° to 800° C. can be made after once cooling the preheated precursor.

The aforesaid $Nb_3Sn$ filaments may each contain as a trace element 0.01 to 5% by weight of at least one element selected from the group consisting of Ti, Ta, Hf, In, Ge, Si, Ga, Mo, Zr, V and Mm.

The use of the $Nb_3Sn$ filament containing a trace amount of at least one element selected from Ti, Ta, Hf, Mo, Zr and V improves the Jc value in higher magnetic field. When In or Ga is used, the Jc value in intermediate or lower magnetic field is improved with improved workability of wire. The addition of Ge, Si or Mn is effective in reducing AC loss.

Nb$_3$Sn containing the above trace element is obtained by the following methods.

(i) Employed is Sn containing 0.01 to 10% by weight of at least one element selected from the group consisting of Ti, In, Ga, Ge, Si and Mn. If the content of the element is less than 0.01% by weight, any effect cannot be recognized, while if it exceeds 10% by weight, the amount of Sn to be supplied is decreased thereby undesirably reducing the amount of Nb$_3$Sn, resulting in degradation in characterisctis of superconducting wire.

(ii) Employed is Nb containing 0.01 to 5% by weight of at least one element selected from the group consisting of Ti, Ta, Hf, Mo, Zr and V. If the content of the element is less than 0.01% by weight, any effect cannot be recognized. If it exceeds 5% by weight, the amount of Nb is decreased, thus the amount of Nb$_3$Sn to be finally produced is undesirably reduced, resulting in deterioration in characteristics.

(iii) Employed is Cu containing 0.01 to 5% by weight of at least one element selected from the group consisting of Ti, In, Ge, Si and Mn. If the content of the element is less than 0.01% by weight, any effect cannot be recognized, while if it exceeds 5% by weight, substantially poor workability will result.

The workability can be improved by incorporating 0.01 to 1% by weight of Sn into the Cu base metal material.

(iv) A composite body of Cu base metal material and Sn base metal material is plated on its surface with at least one element selected from the group consisting of Ti, In, Ge, Si, Mn, Ni and Sn.

In the case of Ti, a stack of a thin plate of Ti on the aforesaid composite body may be used.

(v) The Nb base metal material is plated on its surface with at least one element selected from the group consisting of Ti, Ta, Hf, Mo, Zr and V.

Hereinafter, the method for manufacturing the superconducting wire according to the present invention will be specifically described with reference to the drawings. It should be understood that Examples 1 to 4 are associated with the first aspect of the invention and Examples 5 to 12 associated with the second aspect of the invention.

EXAMPLE 1

FIG. 1 is an explanatory section showing a composite body prior to undergoing extrusion which is incorporated in a Cu billet. In FIG. 1, composite body 1 comprises a billet 2, Nb single core wires 13a and 13b to be described later, and wires 4a of Cu base metal material (hereinafter referred to as "Cu base metal wire").

First, two types of Nb single core wires 13a and 13b were formed which would be Nb base metal filaments in a superconducting wire precursor. Specifically, an Nb base metal rod having a diameter of 11 mm in the form of round bar was inserted into a Cu base metal pipe having inner and outer diameters of 11.8 mm and 16.8 mm, and the resultant was drawn to form a hexagonal wire (denoted by numeral 13a in FIG. 1) of 4.2 mm across flats. In the same manner, the single core wire 13b (4.2 mm across flats) of which Cu wall thickness was larger than that of the single core wire 13a was formed from an Nb base metal rod of 11 mm diameter in the form of round bar and a Cu base metal pipe of 11.8 mm inner diameter and 18.4 mm outer diameter.

The Nb single core wires 13a and 13b and hexagonal Cu base metal wire 4a of 4.2 mm across flats were stuffed in a billet with an arrangement wherein radially from the center of the billet were disposed seven layers of Cu base metal wire 4a, two layers of single core wire 13a, three layers of single core wire 13b, and five layers of single core wire 13a. For simplicity, FIG. 1 depicts only a single line drawing radially. The reason why such an arrangement was employed is as follows. In the production of ε-phase bronze layer by formation of an alloy from the Cu base metal material and a centrally located Sn base metal material by heat treatment, since the boundary of the ε-phase bronze layer appears between the third and fourth layers of Nb single core wires from the center, the diameter of each Nb base metal filament in the third to fifth layers is made smaller than in other layers to slightly enlarge the spacing between adjacent filaments after drawn thereby avoiding mutual contact of Nb$_3$Sn filaments to be produced by a heat treatment.

Thereafter, the billet was subjected to extrusion, the extruded composite body was centrally drilled, and an Sn base metal rod was inserted into the drilled aperture, followed by drawing the resultant to obtain a composite wire. This composite wire was inserted into a Ta pipe serving as a barrier material against Sn diffusion. This pipe was further covered with a Cu pipe for stabilization to achieve secondary composite, followed by being drawn to have a wire diameter of 0.5 mm.

The superconducting wire precursor was subjected to a preheating then to a heat treatment to produce Nb$_3$Sn in the Nb base metal filament portion, yielding an Nb-Sn superconducting wire. The temperature and period of time for this heat treatment need to be those causing a thermal diffusion reaction and forming a superconductor. In the case of Nb$_3$Sn, the heat treatment was performed at 600° to 800° C. for 100 to 200 hours.

Figure 2:
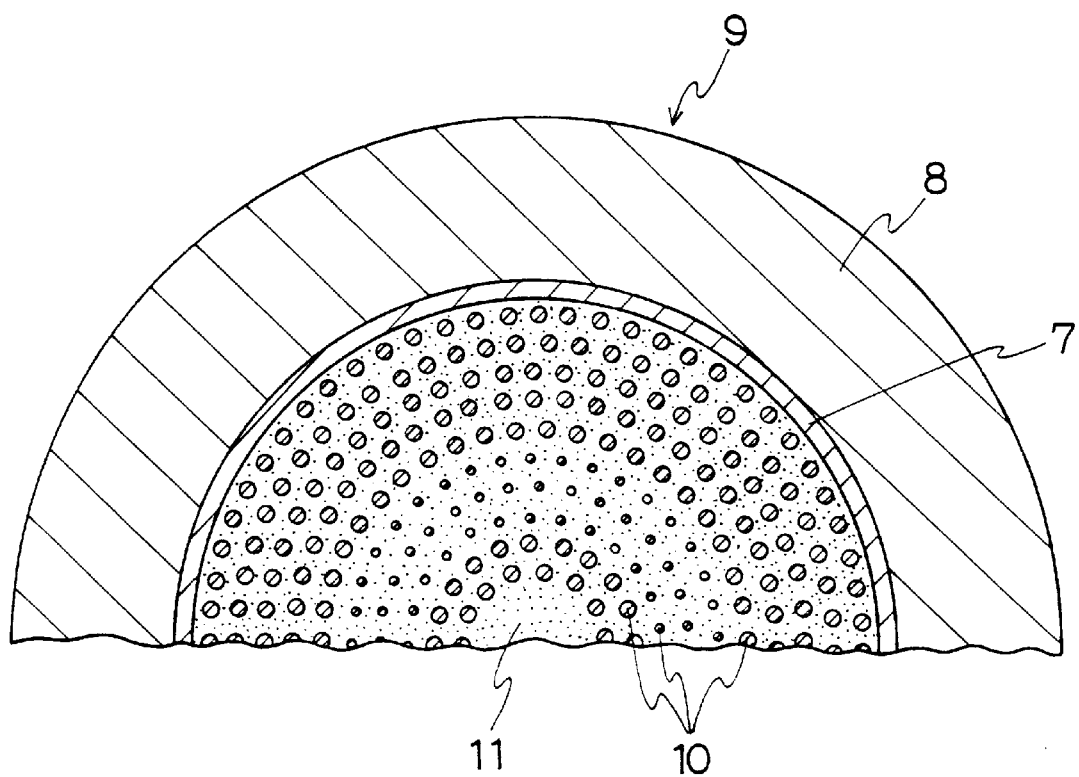
FIG. 2 is an explanatory section view of a superconducting wire in an embodiment according to the first aspect of the present invention.

FIG. 2 is an explanatory section of the thus manufactured superconducting wire having been heat-treated, and wherein denoted at numeral 9 is the superconducting wire after undergoing heat treatment, at numeral 10 Nb$_3$Sn filament, at numeral 11 low-Sn-concentration bronze, at numeral 7 barrier layer of Ta, and at numeral 8 stabilizing layer of Cu.

Nb base metal filaments in the ε-phase bronze layer boundary region were thinner to some extent than in other regions and, hence, the space between adjacent filaments was made slightly larger than in other regions.

The aforesaid low-Sn-concentration bronze means a bronze of an Sn-concentration (about 3% to 10% by weight) lower than that (about 18% to 20% by weight) of bronze once produced during the heat treatment. The reason why the Sn concentration of bronze is lowered is that Sn is further diffused by the heat treatment to produce Nb$_3$Sn. This low-Sn-concentration bronze region substantially corresponds to the region extending from the center of the superconducting wire to the Nb filament region.

The superconducting wire thus obtained was measured for Jc and $d_{eff}$ in liquid helium. The measurement revealed that the Jc value was 820 A/mm$^2$ in a magnetic field of B=12 T. In terms of Jc characteristic the value found was reduced by 5% as compared with that of a conventional typical superconducting wire since the space factor of Nb$_3$Sn was decreased. However, there was found a value of 9 μm in $d_{eff}$, which was about ¼ of the typical superconducting wire. When the two superconducting wires are totally estimated in terms of Jc/$d_{eff}$, the superconducting wire of the present invention is found to have been improved 3.8 times the typical one.

EXAMPLE 2

Figure 3:
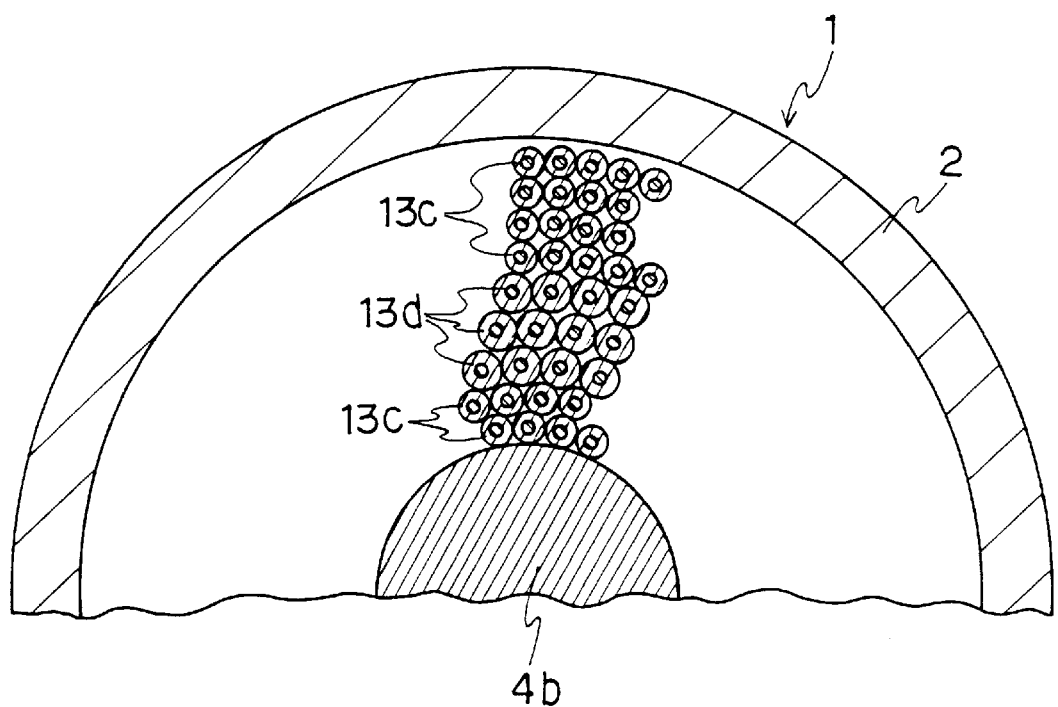
FIG. 3 is an explanatory section view showing a composite body prior to undergoing extrusion in another embodiment of a superconducting wire according to the first aspect of the present invention.

FIG. 3 is an explanatory section of another embodiment of a composite body prior to undergoing extrusion which is incorporated in a Cu billet, and wherein numeral 4b denotes Cu base metal rod.

First, two types of Nb single core wires 13c and 13d were formed which would be Nb base metal filaments in a superconducting wire precursor. Specifically, an Nb base metal rod having a diameter of 11 mm in the form of round bar was inserted into a Cu base metal pipe having inner and outer diameters of 11.8 mm and 16.8 mm, and the resultant was drawn to have a wire diameter of 4.2 mm and to form the single core wire 13c with a small Cu thickness. Similarly, the single core wire 13d having a wire diameter of 4.6 mm with a large Cu thickness was formed by inserting an Nb base metal rod of 11 mm diameter in the form of round bar into a Cu base metal pipe of 11.8 mm inner diameter and 18.4 mm outer diameter, and drawing the resultant. In this Example, by using two types of single core wires different in thickness formed by making Cu thickenss different, the space between adjacent filaments was enlarged in the ε-phase bronze layer boundary region in which mutual contact of filaments was particularly likely.

As shown in FIG. 3, a billet was stuffed radially from the center thereof with Cu base metal rod 4b of 20 mm diameter, two layers of single core wire 13c, three layers of single core wire 13d, and four layers of single core wire 13c (some single core wires are omitted in FIG. 3). The reason why such an arrangement was employed is the same as in Example 1. The clearances formed by thus stuffing single core wires in the form of round bar were inserted with thin Cu base metal wires (omitted in FIG. 3), and the resultant was extruded to form a composite body. Thereafter, the composite body thus extruded was centrally drilled to form an aperture into which an Sn base metal rod was then inserted, and the resultant was further drawn to form a composite wire. This composite wire was inserted into a Ta pipe serving as a barrier material against Sn diffusion and further into a Cu pipe for stabilization to achieve a secondary composition. The resultant was drawn to have a wire diameter of 0.5 mm to yield a superconducting wire precursor.

The superconducting wire precursor was subjected to a preheating then to a heat treatment at 600° to 750° C. for 100 to 200 hours to yield an Nb-Sn superconducting wire.

Figure 4:
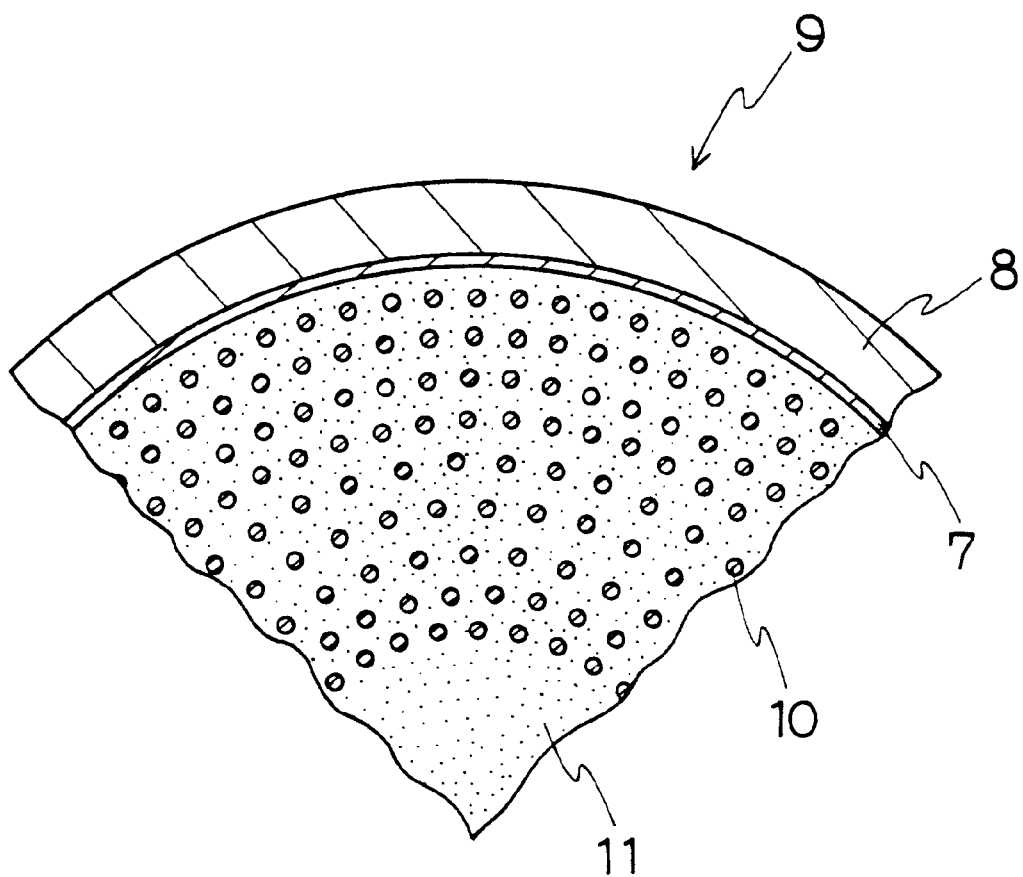
FIG. 4 is an explanatory partial section view showing a superconducting wire in an embodiment according to the first aspect of the present invention.

FIG. 4 is an explanatory section of the thus manufactured superconducting wire having been heat-treated, and wherein denoted at numeral 9 is the superconducting wire after undergoing heat treatment, at numeral 10 $Nb_3Sn$ filament, at numeral 11 low-Sn-concentration bronze layer, at numeral 7 barrier layer of Ta, and at numeral 8 stabilizing material of Cu.

The superconducting wire thus obtained was measured for Jc and $d_{eff}$ in liquid helium. The measurement revealed that the Jc value of this superconducting wire was 805 A/mm² in a magnetic field of B=12 T and the $d_{eff}$ value was 6 μm. When the superconducting wire thus obtained is compared with a conventional one by totally estimating these in terms of $Jc/d_{eff}$, the superconducting wire of the present invention is found to have been improved 5.6 times the conventional one.

EXAMPLE 3

Figure 5:
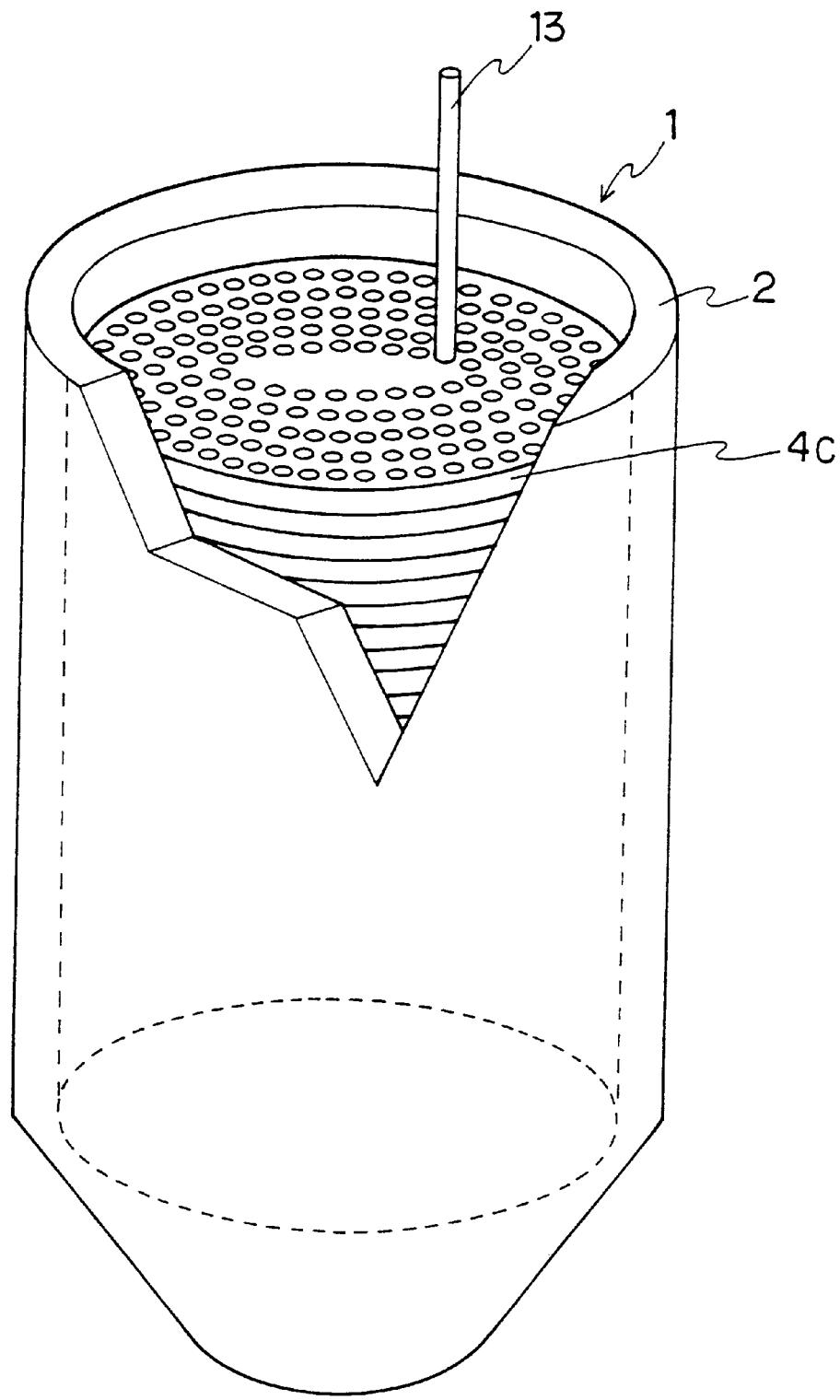
FIG. 5 is a perspective view showing a composite body prior to undergoing extrusion in an embodiment according to the first aspect of the present invention.

FIG. 5 is a perspective view showing a composite body prior to undergoing extrusion which has been incorporated in a Cu billet, and wherein denoted at numeral 1 is the composite body prior to undergoing extrusion, at numeral 2 the Cu billet, at numeral 13 Nb base metal rods becoming filaments of superconducting wire precursor, and at numeral 4c Cu base metal material in the form of disk.

The Cu base metal material 4c in the form of disk was formed in the following manner. 309 apertures of 4.95 mm diameter were formed in an oxygen-free copper disk of 160 mm diameter and 10 mm thickness using an NC drilling machine. In this case, apertures between the innermost first and second layers (counted radially) were arranged closely to each other, those between the second and fourth layers sparsely, and those between the fourth and outermost fifth layers closely. 30 pieces of the Cu base metal material disk 4c were stuffed in a billet container of oxygen-free copper of 180 mm outer diameter and 160 mm inner diameter with their apertures registered with each other. Nb base metal rods 13 of 4.9 mm diameter were inserted into the apertures of the stacked Cu disks, respectively. Finally, air in the billet was evacuated, and a cover was welded to the billet to form a composite billet. Insertion of the Nb base metal rods into the oxygen-free copper disks in stacks was conducted with ease.

The composite billet was extruded and centrally formed with an aperture into which an Sn base metal rod was then inserted. The resultant was drawn to form a composite wire. The composite wire was inserted in a Ta pipe serving as a barrier material against Sn diffusion, and the resultant was further inserted into a Cu pipe to achieve secondary composition, followed by being drawn to have a wire diameter of 0.5 mm.

The superconducting wire precursor thus formed was subjected to a preheating then to a heat treatment at 600° to 750° C. for 100 to 200 hours to yield an Nb-Sn superconducting wire.

Figure 6:
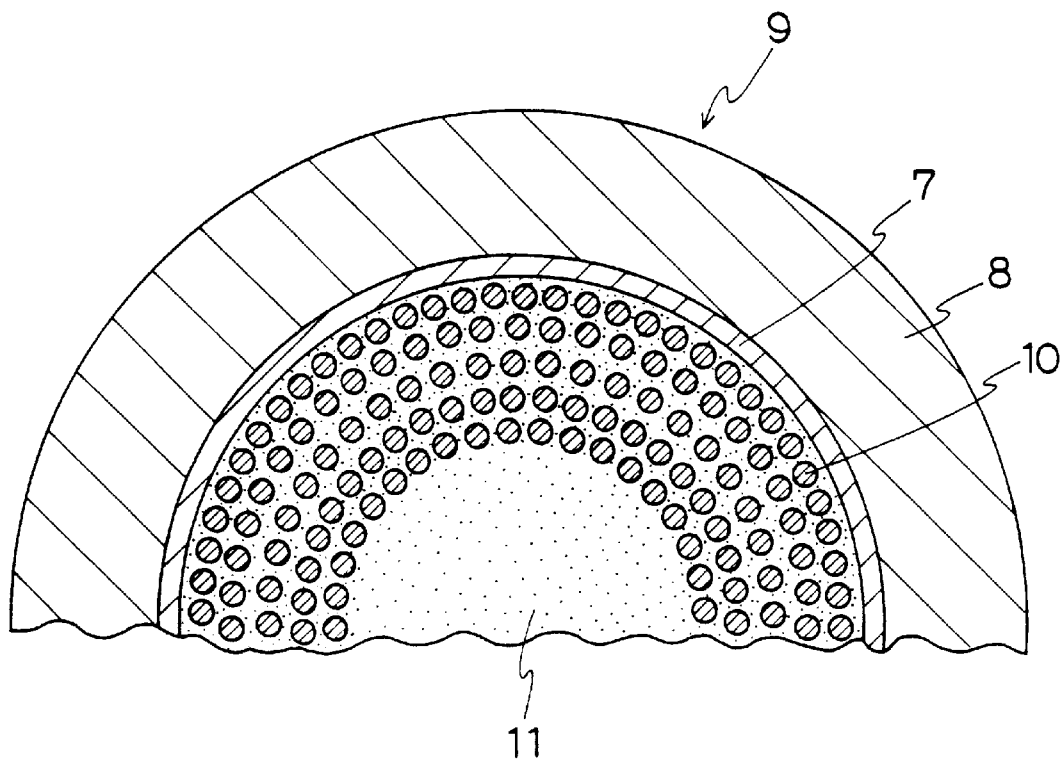
FIG. 6 is an explanatory section view of a superconducting wire in an embodiment according to the first aspect of the present invention.

FIG. 6 is an explanatory section of the thus obtained superconducting wire having been heat-treated, and wherein denoted at numeral 9 is the superconducting wire having been heat treated, at numeral 10 $Nb_3Sn$ filament, at numeral 11 low-Sn-concentration bronze, at numeral 7 a barrier layer of Ta, and at numeral 8 a stabilizing layer of Cu.

The superconducting wire thus obtained was measured for Jc and $d_{eff}$ in liquid helium. The measurement revealed that the Jc value of this superconducting wire was 930 A/mm² in a magnetic field of B=12T and the $d_{eff}$ value was 6 μm. When the superconducting wire thus obtained is compared with a conventional one by totally estimating these in terms of $Jc/d_{eff}$, the superconducting wire of the present invention is found to have been improved 5.6 times the conventional one.

EXAMPLE 4

A superconducting wire may be required to be improved in Jc characteristic more than in $d_{eff}$ characteristic. To meet this requirement, as a variation of the embodiment of Example 1 such an arrangement is offered in this Example that single core wires are disposed so that Nb base metal filaments would exist only in the region outside the boundary of the aforementioned ε-phase bronze layer when ε-phase bronze layer is produced during the heat treatment. This arrangement avoids $Nb_3Sn$ filaments from coming into mutual contact or coupling while effectively reducing the $d_{eff}$ value.

Figure 7:
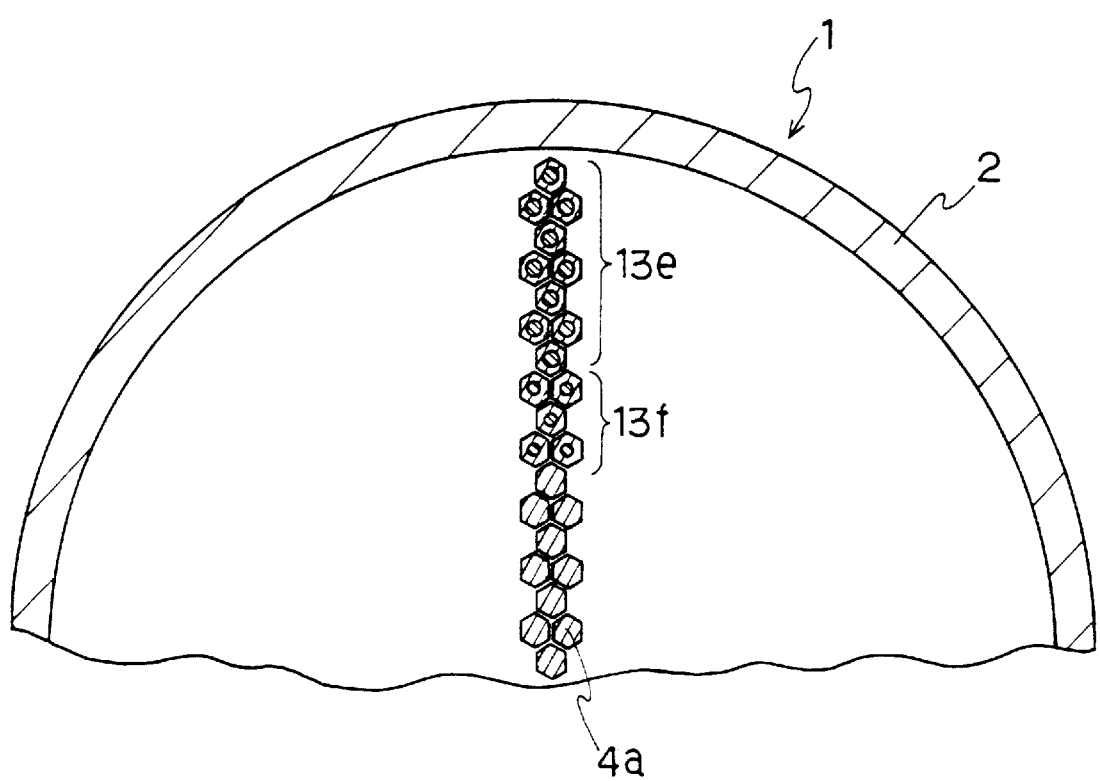
FIG. 7 is an explanatory section view showing a composite body prior to undergoing extrusion in an embodiment of a superconducting wire according to the first aspect of the present invention.

FIG. 7 is an explanatory section showing a composite body prior to undergoing extrusion which is incorporated in Cu billet. In FIG. 7, composite body 1 comprises Cu billet 2, hexagonal Nb single core wires 13e and 13f, and hexagonal Cu base metal wire 4a of 4.2 mm across flats. To make the space between adjacent filaments larger than in the embodiment of Example 1, the single core wires 13e and 13f were formed by inserting Nb base metal rods in the form of round bar into a Cu pipe of 11.8 mm inner diameter and 17.4 mm outer diameter for 13e and a Cu pipe of 11.8 mm inner diameter and 19.3 mm outer diameter for 13f, respectively and drawing the resultants to form hexagonal single core wires of 4.2 mm across flats.

The Nb single core wires and Cu base metal wire a were stuffed in a billet with an arragement wherein radially from the center were disposed seven layers of Cu base metal wire 4a, three layers of single core wire 13f, and seven layers of single core wire 13e. For simplicity, FIG. 7 depicts only a single line of single core wires 13e and 13f and Cu base metal wire 4a which is radially drawing though these wires are stuffed in the overall section. The resulting billet was subjected to extrusion, the extruded composite body was centrally formed with an aperture, and an Sn alloy rod of 14 mm diameter containing 1.5% by weight of Ti was inserte into the aperture, followed by drawing the resultant to form a composite wire. The composite wire is circumferentially plated with Sn to about 30 μm thickness, inserted into a Ta pipe serving as a barrier material against Sn diffusion, and further inserted into a Cu pipe for stabilization to achieve secondary composition, followed by being drawn to have a wire diameter of 0.5 mm. The reason why Sn plating was conducted is that by diffusing Sn to the outer portion the amount of the Sn base metal material to be centrally located is reduced thereby minimizing the area of the ε-phase bronze layer to be produced by the centrally-located Sn.

The superconducting wire precursor was subjected to a preheating and then to a heat treatment at 600° C. to 800° C. for 100 to 200 hours to yield an Nb-Sn superconducting wire. The temperature for this heat treatment needs to be a temperature causing a thermal diffusion reaction, thus forming a superconductor. In the case of $Nb_3Sn$, the heat treatment temperature is from 600° to 800° C.

Figure 8:
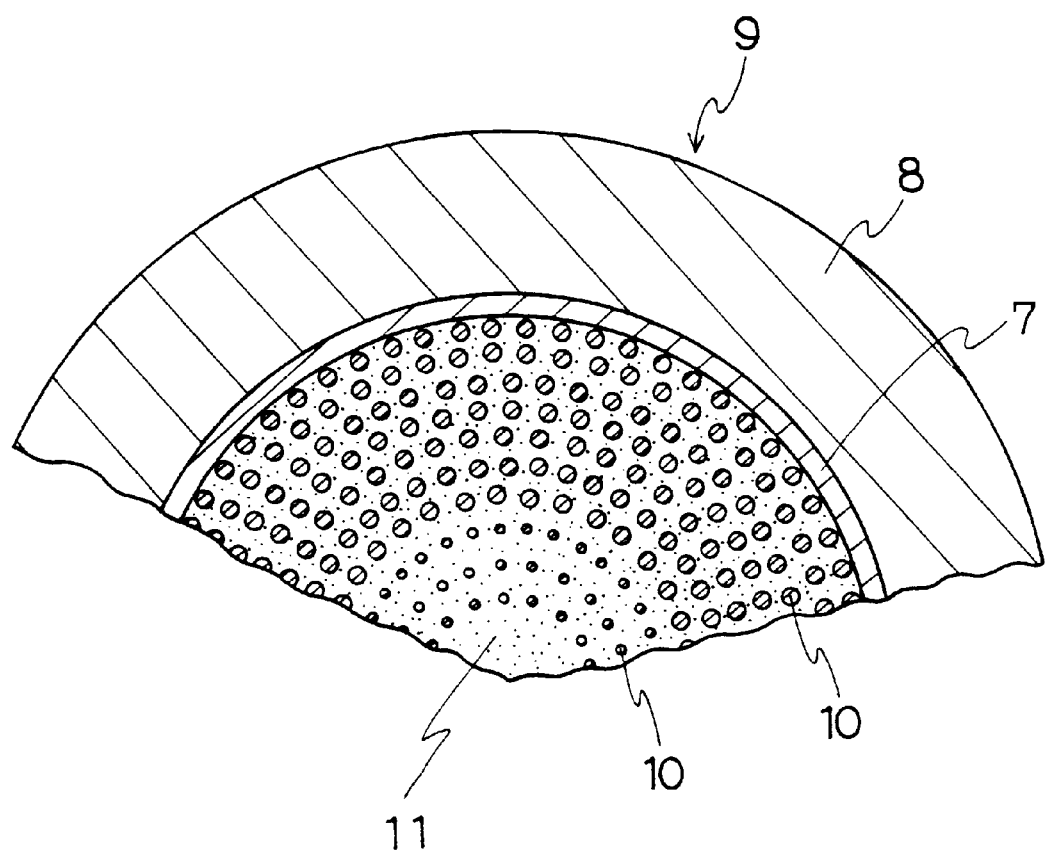
FIG. 8 is an explanatory partial section view showing a superconducting wire in an embodiment according to the first aspect of the present invention.

FIG. 8 is an explanatory section of the thus manufactured superconducting wire having been heat-treated, and wherein denoted at numeral 9 is the superconducting wire after undergoing the heat treatment, at numeral 10 $Nb_3Sn$ filament, at numeral 11 low-Sn-concentration bronze, at numeral 7 a barrier layer of Ta, and at numeral 8 a stabilizing layer of Cu.

The superconducting wire thus obtained was measured for Jc and $d_{eff}$ in liquid helium. The measurement revealed that the Jc value was 720 A/mm² in a magnetic field of B=12T. In terms of Jc characteristic the value found was reduced by 16% as compared with that of the conventional superconducting wire since the space factor of $Nb_3Sn$ was decreased. However, there was found a value of 4 μm in $d_{eff}$, which was about 1/9 as large as that (36 μm) of the conventional superconducting wire. This value is superior even to those of the embodiments of Examples 1 to 3. When this superconducting wire is compared with the conventional one by total estimation in terms of $Jc/d_{eff}$, the superconducting wire of the present invention is found to have been improved 7.5 times the conventional one.

It should be understood that although the superconducting wires of foregoing Examples 1 to 4 each have a stabilizing layer of Cu and a diffusion barrier layer of Ta, no problem will result even if these layers are omitted.

EXAMPLE 5

Figure 9:
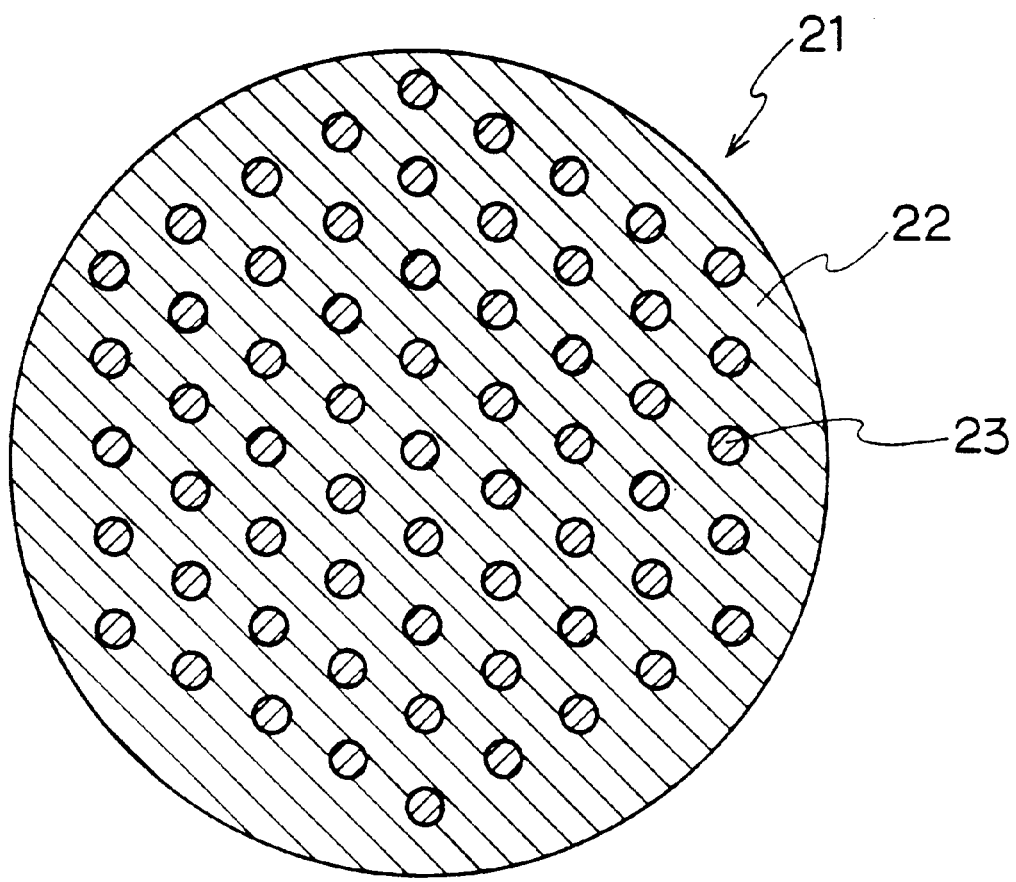
FIG. 9 is an explanatory section view of a superconducting wire precursor in an embodiment according to a second aspect of the present invention.
Figure 10:
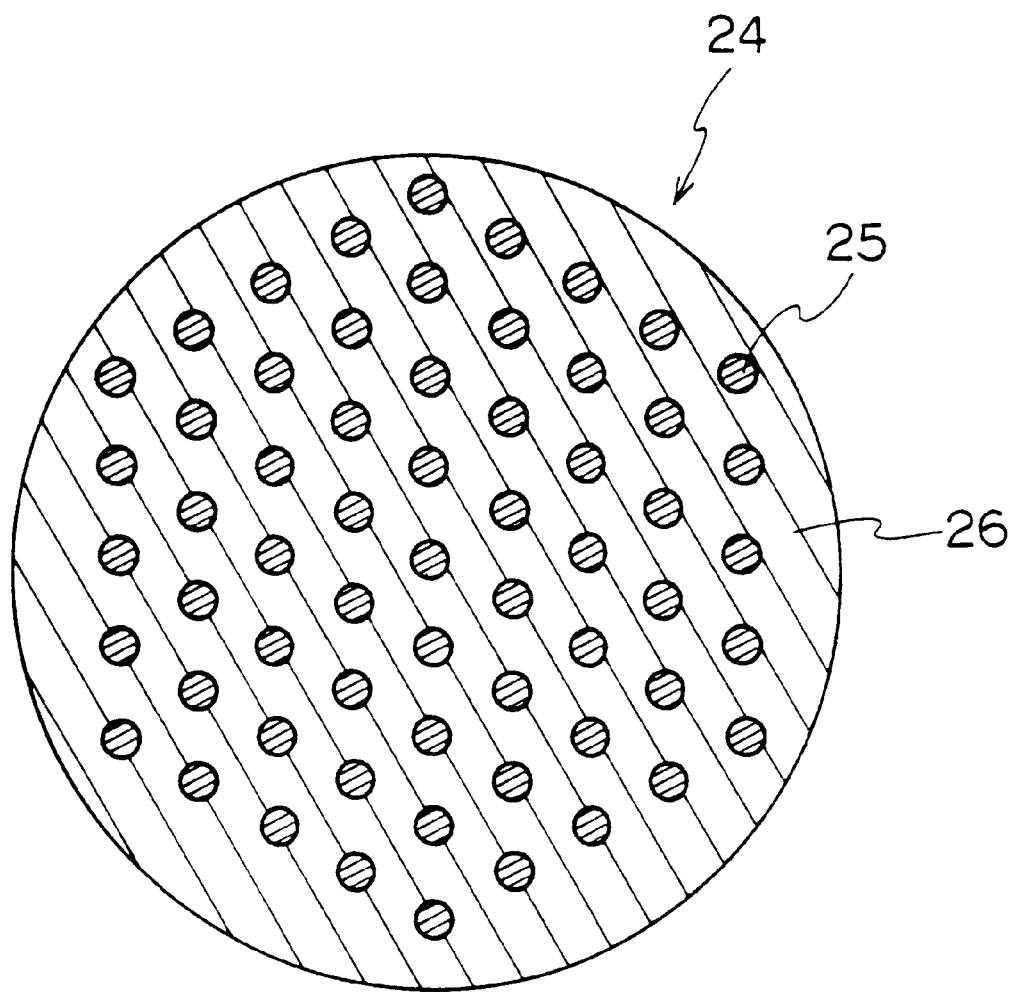
FIG. 10 is an explanatory section view of a compound superconducting wire in an embodiment according to the second aspect of the present invention.

FIG. 9 is an explanatory section showing a superconducting wire precursor according to the second aspect of the present invention, which has been reduced in section area by drawing and has not yet been subjected to a heat treatment. In FIG. 9, the superconducting wire precursor 21 comprises a composite body 22 of Cu base metal material and Sn base metal material, and Nb base metal filaments 23. FIG. 10 is an explanatory section showing a superconducting wire obtained by subjecting the superconducting wire precursor to the heat treatment. The superconducting wire 24 in FIG. 10 comprises $Nb_3Sn$ filaments 25, and bronze layer 26 of which Sn concentration is lowered by a reaction of Nb with Sn diffused by the heat treatment.

The composite body 22 of the Cu base metal material and Sn base metal material was formed in the following manner. First, thick plates of 15 mm thickness each resulting from rolling and integrating ten oxygen-free copper plates of 2 mm thickness and nine Sn plates of 1 mm thickness in an alternately stacked fashion were tightly stuffed in an oxygen-free copper container of 180 mm outer diameter and 160 mm inner diameter along the length thereof. Next, air in the container was evacuated, a cover was welded to the container, and the resultant was subjected to cold hydrostatic extrusion to form a composite in the form of a rod of 90 mm diameter. Finally, the oxygen-free copper in an outer peripheral portion of this composite rod was eliminated by external cutting using a lathe to form a columnar composite 22 of 80 mm diameter.

The composite 22 was cut to a length of 100 mm and then drilled to form 127 apertures of 4.1 mm diameter. Next, Nb base metal wires of 4.0 mm diameter and 100 mm length were individually inserted into the apertures of the composite, and the resultant was accommodated in an oxygen-free copper container of 90 mm outer diameter and 80 mm inner diameter. Air in the container was evacuated, and a cover was welded to the container by electron beam welding to form a composite billet. The composite billet was subjected to cold hydrostatic extrusion and then eliminated of oxygen-free copper in an outer peripheral portion thereof by external cutting using a lathe. The resultant was drawn to have a final diameter and then twisted to form a superconducting wire precursor of 0.2 wire diameter. The thus obtained superconducting wire precursor was subjected to a preheating then to a heat treatment at 600° to 800° C. for 50 to 200 hours to form a superconducting wire having $Nb_3Sn$ superconductor produced in the Nb base filament portion.

The superconducting wire thus obtained was measured for Jc and $d_{eff}$ in liquid helium. The measurement revealed that the Jc value of this superconducting wire was 550 A/mm² in a magnetic field of B=12 T and the $d_{eff}$ value was 5 μm. When the superconducting wire thus obtained is compared with an $Nb_3Sn$ superconducting wire obtained by the prior art internal diffusion method by totally estimating the two in terms of $Jc/d_{eff}$, this superconducting wire of the present invention is found to have been improved 4.4 times the prior art superconducting wire.

EXAMPLE 6

Figure 11:
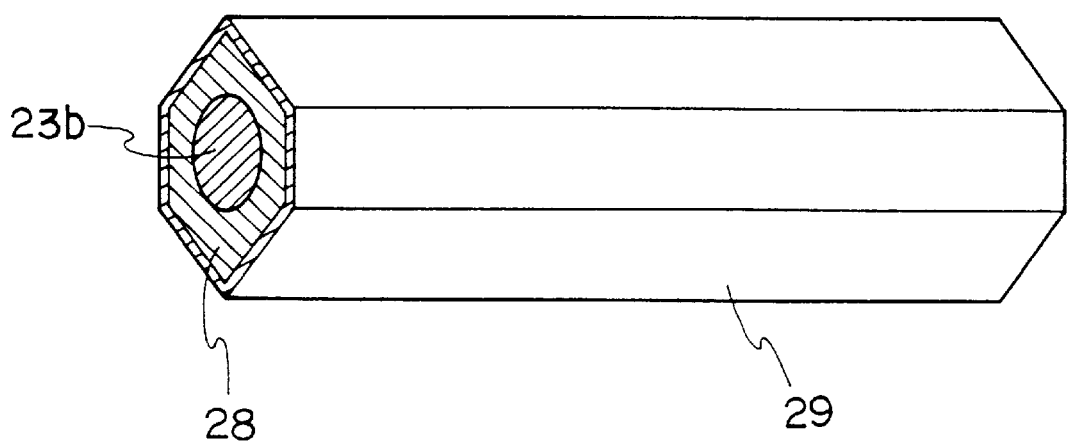
FIG. 11 is an explanatory view showing an embodiment of a composite single core wire for use in manufacturing a superconducting wire precursor according to the first or second aspect of the present invention.

FIG. 11 is an explanatory view showing one embodiment of a composite single core wire which will provide an Nb base metal filament in a superconducting wire precursor according to the second aspect of the present invention. The composite single core wire comprises Nb base metal rod 23b containing 1% by weight of Ti, Cu base metal material 28, and Sn plated layer 29 covering the Cu base metal material.

This composite single core wire was formed in the following manner. An Nb base metal rod of 11 mm diameter incorporated with 1% by weight of Ti was inserted into a Cu pipe of 11.8 mm inner diameter and 18.4 mm outer diameter, and the resultant was drawn to form a hexagonal single core wire of 4.2 mm across flats. The single core wire was covered with an Sn-plated layer 29 of about 100 μm thickness to yield the composite single core wire shown in FIG. 11.

An oxygen-free copper billet of 180 mm outer diameter and 160 mm inner diameter was stuffed with 1225 pieces of the composite single core wire thus formed, air in the billet was evacuated, and a cover was welded to the billet by electron beam welding to form a composite billet. The composite billet was subjected to cold hydrostatic extrusion and drawn to form a composite body. The resultant composite body was inserted into a Ta pipe serving as a barrier material against Sn diffusion, and further inserted into a Cu pipe for stabilization to achieve secondary composition, followed by being drawn to have a final wire diameter. The composite body having the final diameter was twisted to yield a superconducting wire precursor of 0.3 mm wire diameter.

Figure 12:
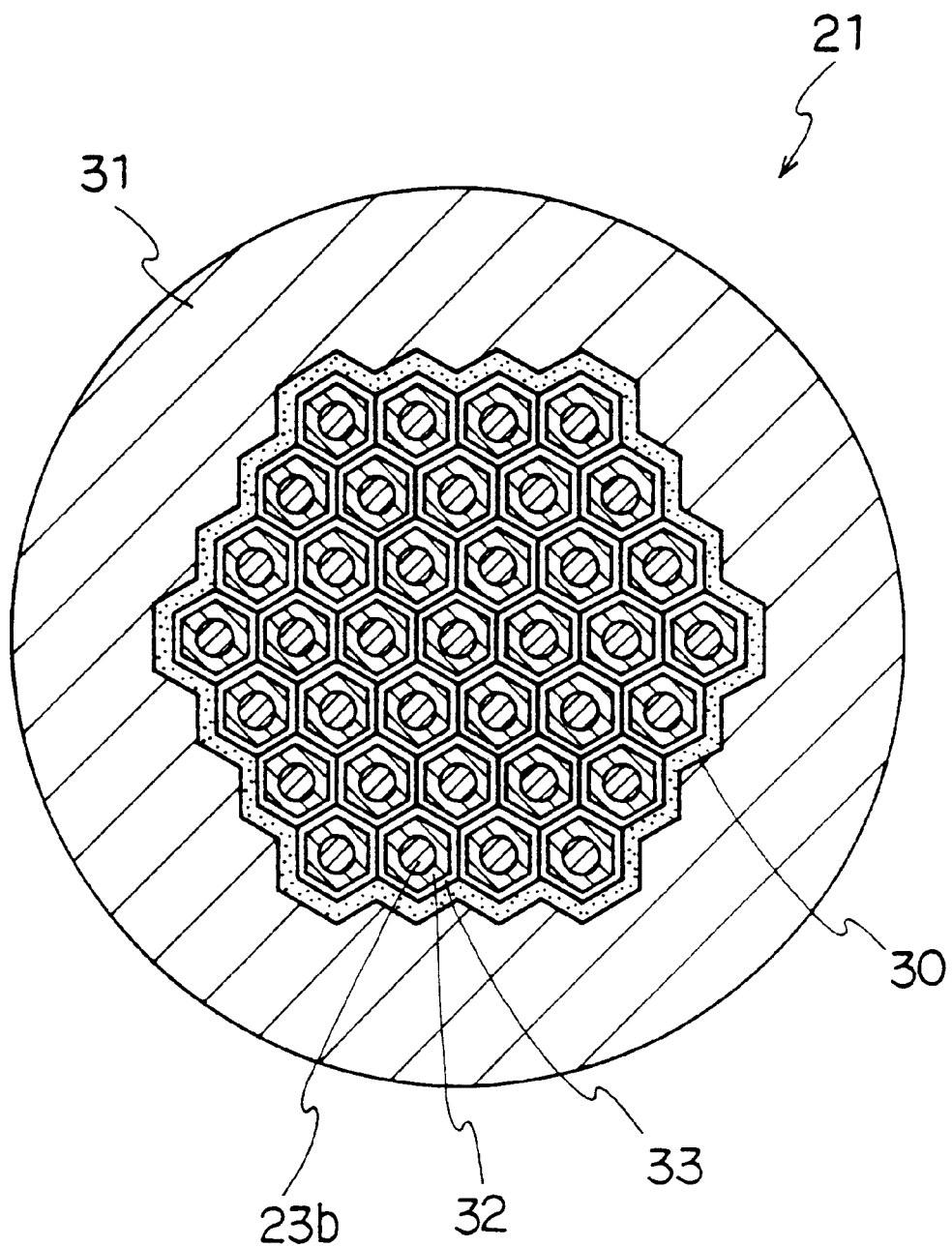
FIG. 12 is an explanatory section view showing another embodiment of a superconducting wire precursor according to the second aspect of the present invention.

FIG. 12 is an explanatory section of the superconducting wire precursor thus obtained, and wherein denoted at numeral 21 is the superconducting wire precursor, at numeral 23b Nb base metal filament containing 1% by weight of Ti, at numeral 30 Ta barrier layer, at numeral 31 Cu layer for stabilization, at numeral 32 Cu base metal material, and at numeral 33 Sn-plated layer on the surface of the Cu base metal material.

Figure 13:
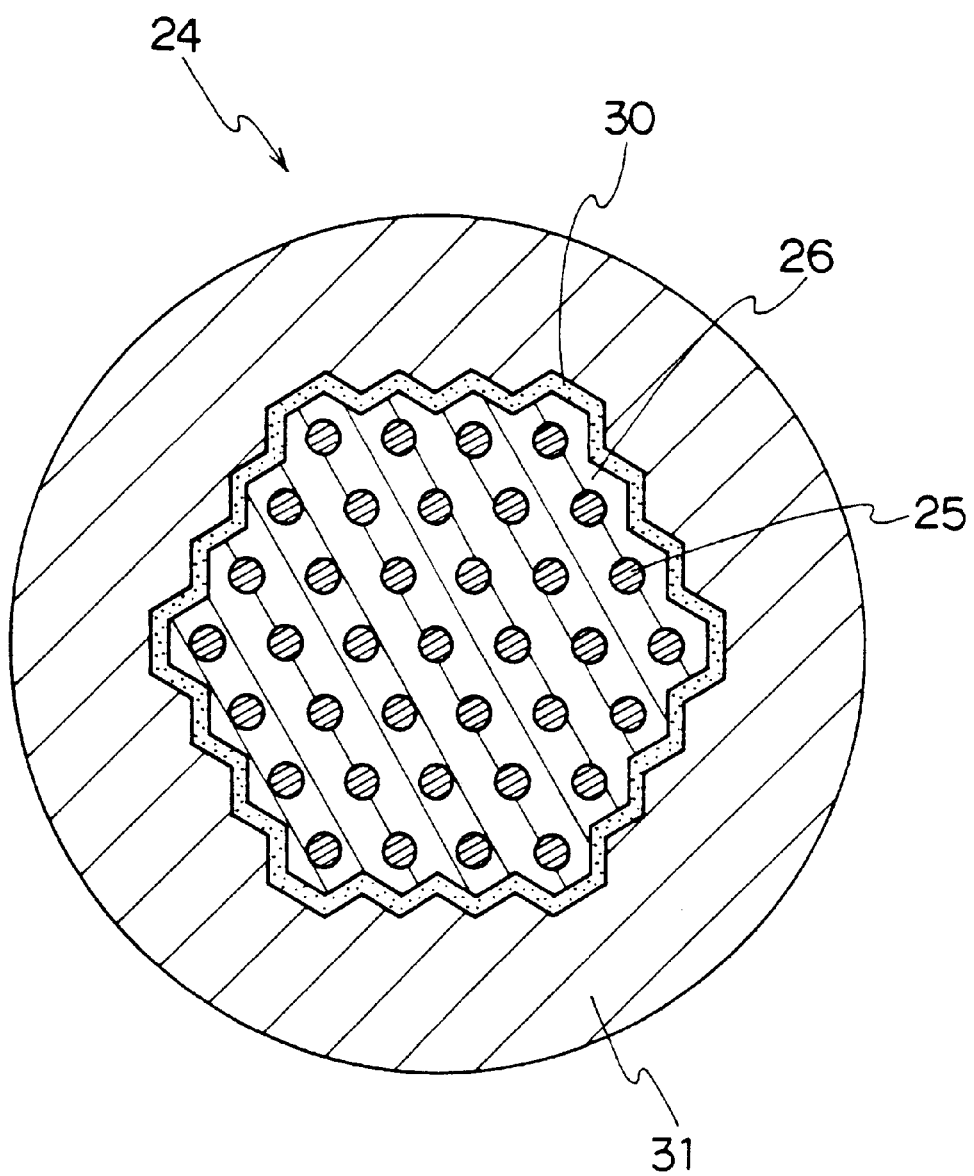
FIG. 13 is an explanatory section view showing another embodiment of a compound superconducting wire according to the second aspect of the present invention.

The thus obtained superconducting wire precursor was subjected to a preheating then to a heat treatment at 600° to 800° C. for 50 to 200 hours to form a superconducting wire having Nb$_3$Sn superconductor produced in the Nb base filament portion. FIG. 13 is an explanatory section of the superconducting wire thus obtained, and wherein the superconducting wire 24 comprises Nb$_3$Sn filaments 25, low-Sn-concentration bronze 26, barrier layer 30 of Ta, and Cu layer 31 for stabilization.

The superconducting wire thus obtained was measured for Jc and d$_{eff}$ in liquid helium. The measurement revealed that the Jc value of this superconducting wire was 850 A/mm$^2$ in a magnetic field of B=12T and the d$_{eff}$ value was 3 μm. When the superconducting wire thus obtained is compared with an Nb$_3$Sn superconducting wire containing Ti and obtained by the prior art internal diffusion method by totally estimating the two in terms of Jc/d$_{eff}$, this superconducting wire of the present invention is found to have been improved 7.1 times the prior art superconducting wire.

EXAMPLE 7

Figure 14:
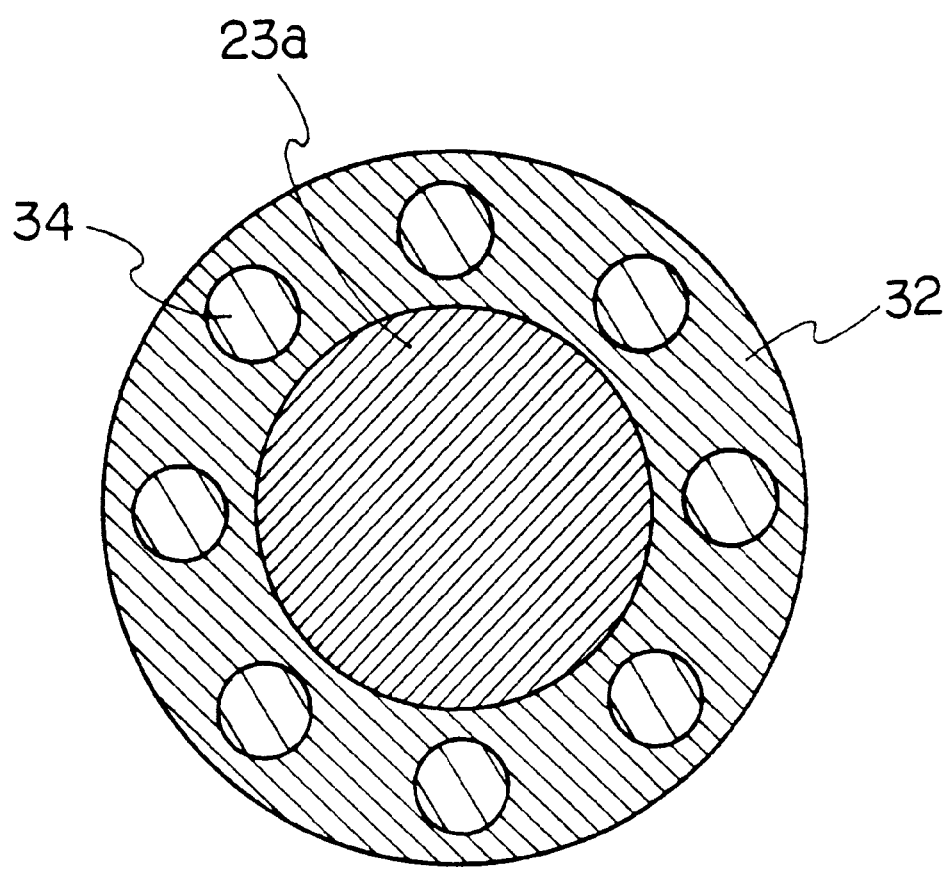
FIG. 14 is an explanatory section view showing another embodiment of a composite single core wire for use in manufacturing a superconducting wire precursor according to the second aspect of the present invention.

FIG. 14 is an explanatory view showing one embodiment of a composite single core wire prior to being reduced in area for use in manufacturing a superconducting wire precursor according to the second aspect of the present invention. The composite single core wire comprises Cu base metal material 32, Nb base metal rod 23a, and Sn base metal rods 34 containing In in an amount of 7% by weight. Such a composite single core wire was formed in the following manner.

First, an Nb base metal rod of 13.9 mm diameter was centrally inserted into an oxygen-free copper billet container of 25 mm outer diameter and 14 mm inner diameter having eight apertures of 3.5 mm diameter as shown in FIG. 14. Eight Sn base metal rods of 3.4 mm diameter containing 7% by weight of In were individually inserted into the apertures lying around the center of the container. Air in the billet container was evacuated, a cover was welded to the billet container by electron beam welding. The resultant container was subjected to cold hydrostatic extrusion and then drawn to form a hexagonal composite single core wire of 4.2 mm across flats.

A Cu billet similar to that in Example 6 was stuffed with 1225 pieces of the single core wire thus formed, air in the billet was evacuated, and a cover was welded by electron beam welding to form a composite billet. This composite billet was subjected to cold hydrostatic extrusion and then drawn to form a composite wire. The resultant composite wire was inserted into a Ta pipe to serve as a barrier material against Sn diffusion, and further inserted into a Cu pipe for stabilization to achieve secondary composition, followed by being drawn to have a final wire diameter. The composite wire of the final diameter was twisted to yield a superconducting wire precursor of 0.3 mm wire diameter.

Figure 15:
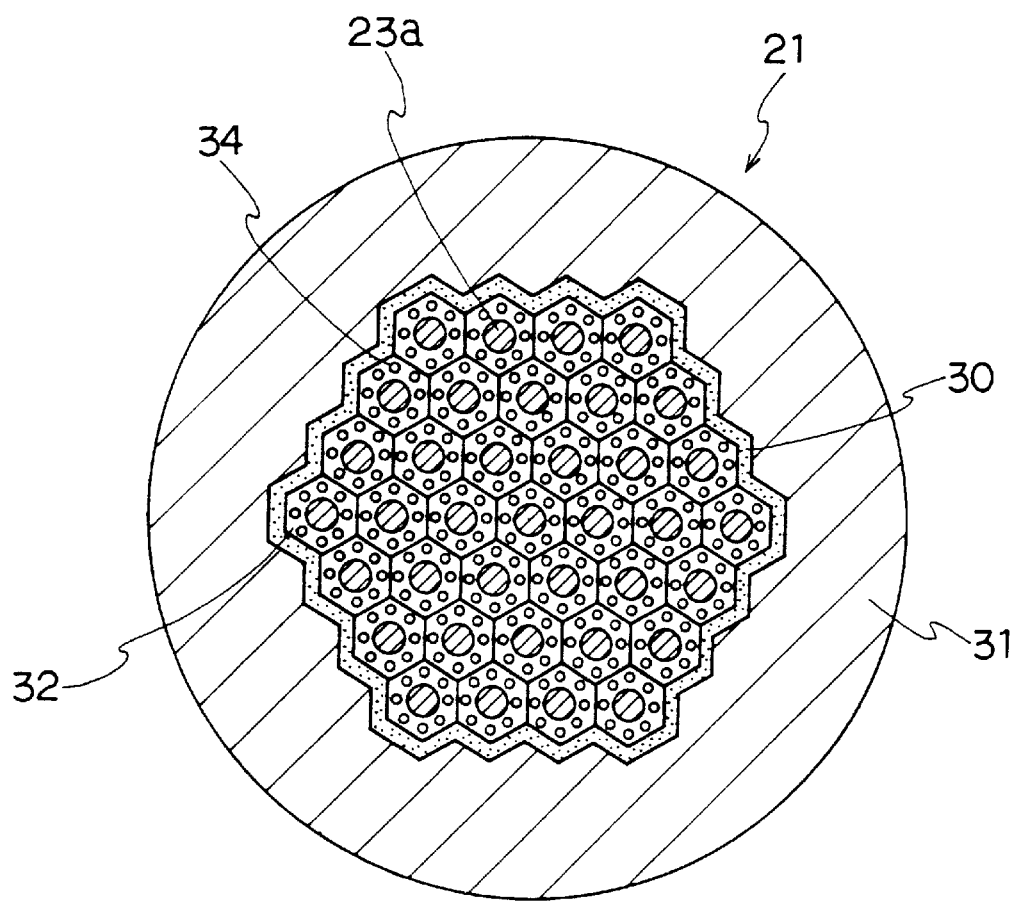
FIG. 15 is an explanatory section view showing another embodiment of a superconducting wire precursor according to the second aspect of the present invention.

FIG. 15 is an explanatory section of the superconducting wire precursor thus obtained, and wherein superconducting wire precursor 21 comprises Nb base metal filaments 23a, Ta barrier layer 30, Cu layer 31 for stabilization, Cu base metal material 32, and Sn base metal material 34 containing 7% by weight of In.

The thus obtained superconducting wire precursor was subjected to a preheating and then to a heat treatment at 600° to 800° C. for 50 to 200 hours to form a superconducting wire having Nb$_3$Sn superconductor produced in the Nb base metal filament portion. The sectional structure of the thus obtained superconducting wire was similar to that shown in FIG. 13.

The superconducting wire thus obtained was measured for Jc and d$_{eff}$ in liquid helium. The measurement revealed that the Jc value of this superconducting wire was 633 A/mm$^2$ in a magnetic field of B=12 T and the d$_{eff}$ value was 3 μm. When the superconducting wire thus obtained is compared with an Nb$_3$Sn superconducting wire containing In and obtained by the prior art internal diffusion method by totally estimating the two in terms of Jc/d$_{eff}$, this superconducting wire of the present invention is found to have been improved 7.0 times the prior art superconducting wire.

EXAMPLE 8

Figure 16:
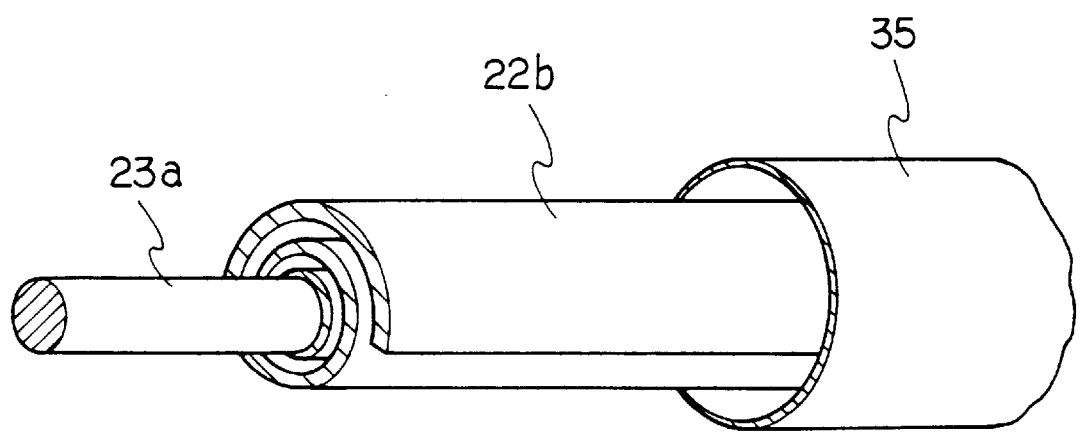
FIG. 16 is an explanatory view showing another embodiment of a composite single core wire for use in manufacturing a superconducting wire precursor according to the second aspect of the present invention.

FIG. 16 is an explanatory view showing a constitution of a composite single core wire prior to being reduced in section area for use in manufacturing a superconducting wire according to the second aspect of the present invention. The composite single core wire comprises composite body 22b of Cu containing 1% by weight of Ti and Sn, and Nb base metal rod 23a.

The composite body 22b was a thin plate formed by rolling to integrate a stack of two Cu plates of 1 mm thickness containing 1% by weight of Ti and an Sn plate of 1 mm thickness sandwiched between the Cu plates. The composite body 22b in the form of thin plate was cut to a size of 140 mm×1000 mm and then wound around an Nb base metal rod 23a of 10 mm diameter and 1000 mm length in the form of round bar. The resultant was inserted into an oxygen-free copper pipe 35 of 18 mm inner diameter and 19 mm outer diameter, followed by drawing to form a hexagonal composite single core wire of 4.2 mm across flats.

An oxygen-free copper billet of 180 mm outer diameter and 160 mm inner diameter was stuffed with 1225 pieces of the single core wire thus formed, air in the billet was evacuated, and a cover was welded by electron beam welding. This billet was subjected to cold hydrostatic extrusion and then drawn to form a composite wire. The resultant composite wire was inserted into a Ta pipe serving as a barrier material against Sn diffusion, and further inserted into a Cu pipe for stabilization to achieve secondary composition, followed by being drawn to have a final wire diameter. The composite wire of the final diameter was twisted to yield a superconducting wire precursor of 0.3 mm diameter.

Figure 17:
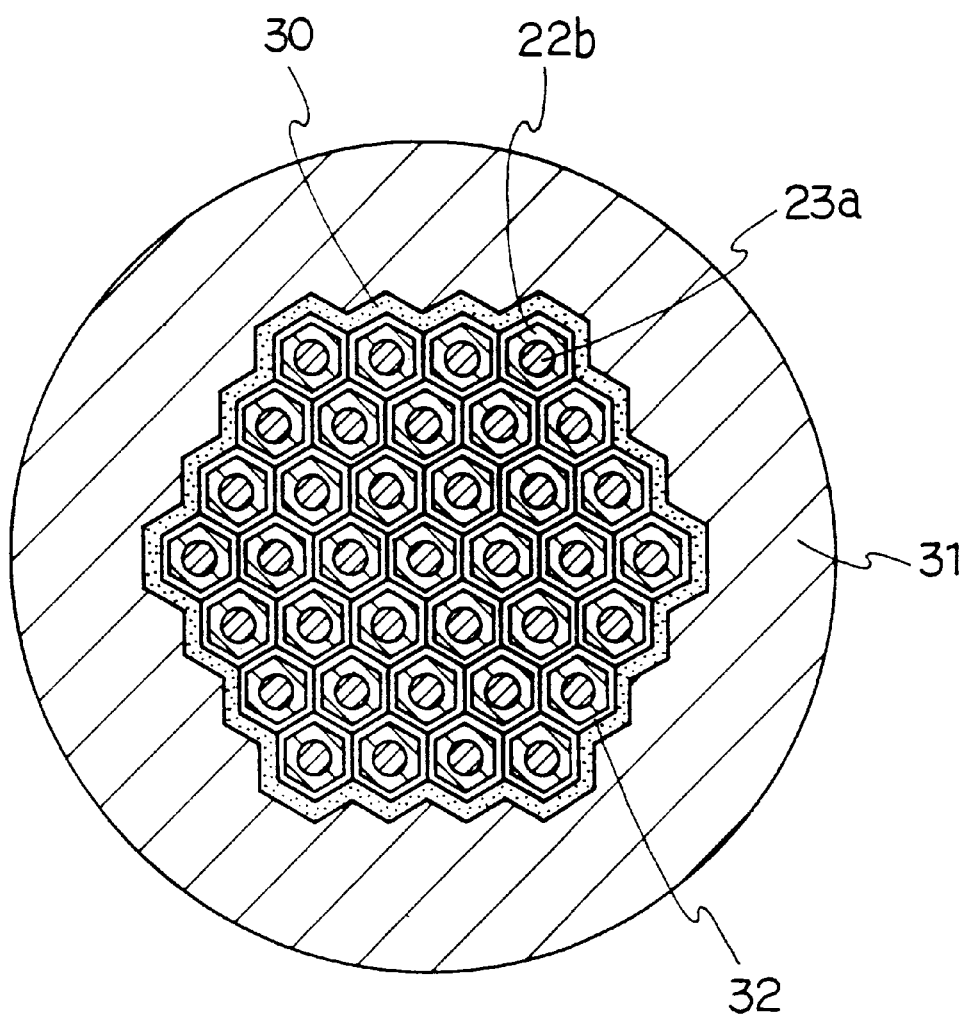
FIG. 17 is an explanatory section view showing another embodiment of a superconducting wire precursor according to the second aspect of the present invention.

FIG. 17 is an explanatory section of the superconducting wire precursor thus obtained, and wherein superconducting wire precursor comprises a composite body 22b of Cu containing 1% by weight of Ti and Sn, Nb base metal filaments 23a, Ta barrier layer 30, Cu layer 31 for stabilization, and Cu base metal material 32.

The thus obtained superconducting wire precursor was subjected to a preheating and then to a heat treatment at 600° to 800° C. for 50 to 200 hours to form a superconducting wire having $Nb_3Sn$ superconductor produced in the Nb base metal filament portion. The sectional structure of the thus obtained superconducting wire was similar to that shown in FIG. 13.

The superconducting wire thus obtained was measured for Jc and $d_{\it eff}$ in liquid helium. The measurement revealed that the Jc value of this supercoducting wire was 900 A/mm² in a magnetic field of B=12 T and the $d_{\it eff}$ value was 3 μm. When the superconducting wire thus obtained is compared with an $Nb_3Sn$ superconducting wire containing Ti and obtained by the prior art internal diffusion method by totally estimating the two in terms of $Jc/d_{\it eff}$, this superconducting wire of the present invention is found to have been improved 7.5 times the prior art superconducting wire.

EXAMPLE 9

Figure 18:
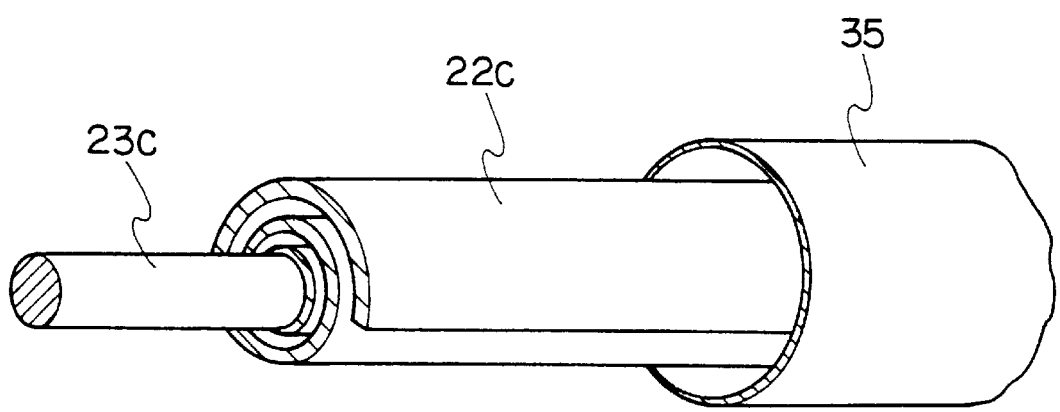
FIG. 18 is an explanatory view showing another embodiment of a composite single core wire for use in manufacturing a superconducting wire precursor according to the second aspect of the present invention.

FIG. 18 is an explanatory view showing a constitution of a composite single core wire prior to being reduced in section area for use in manufacturing a superconducting wire according to the second aspect of the present invention. The composite single core wire comprises composite body 22c of a Cu base metal material plated on its surface with Sn, Nb base metal rod 23c plated on its surface with Ti, and oxygen-free copper pipe 35.

An Nb base metal rod of 10 mm diameter which become a filament of a superconducting wire was electro-coated with a Ti layer of about 45 μm thickness. An oxygen-free copper plate of about 200 mm width and 0.5 mm thickness was plated with an Sn layer of about 0.1 mm to form a Cu-Sn composite body 22c. The composite body 22c was wound about five times around the Ti-plated Nb base metal rod 23c as a core, then inserted into oxygen-free copper pipe 35 of 18 mm inner diameter and 19 mm outer diameter, followed by being drawn to form a hexagonal composite single core wire of 4.2 mm across section.

A Cu billet similar to that used in Example 6 was stuffed with 1225 pieces of the composite single core wire thus formed, air in the billet was evacuated, and a cover was welded to the billet by electron beam welding. The resultant was then subjected to cold hydrostatic extrusion and drawn to form a composite wire. The composite wire thus formed was further drawn to have a final wire diameter and then twisted to form a superconducting wire precursor of 0.3 mm wire diameter.

Figure 19:
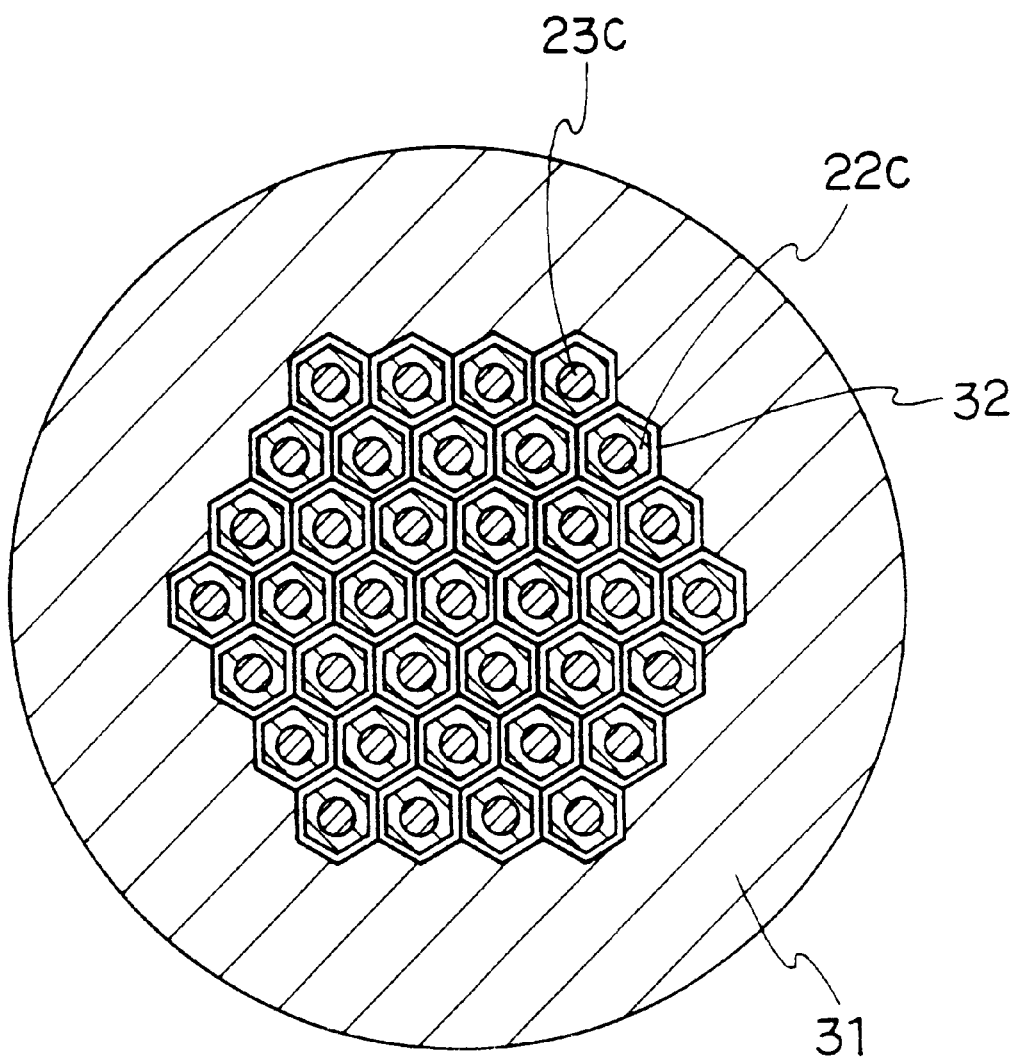
FIG. 19 is an explanatory section view showing another embodiment of a superconducting wire precursor according to the second aspect of the present invention.

FIG. 19 is an explanatory section of the superconducting wire precursor thus obtained, wherein the superconducting wire precursor comprises Cu composite body 22c plated on its surface with Sn, Nb base metal filaments 23c plated on its surface with Ti, Cu layer 31 for stabilization, and Cu base metal material 32.

The thus obtained superconducting wire precursor was subjected to a preheating and then to a heat treatment at 600° to 800° C. for 50 to 200 hours to form a superconducting wire having $Nb_3Sn$ superconductor produced in the Nb base metal filament portion. The sectional structure of the thus obtained superconducting wire was similar to that shown in FIG. 13.

The superconducting wire thus obtained was measured for Jc and $d_{\it eff}$ in liquid helium. The measurement revealed that the Jc value of this supercoducting wire was 900 A/mm² in a magnetic field of B=12T and the $d_{\it eff}$ value was 3 μm. When the superconducting wire thus obtained is compared with an $Nb_3Sn$ superconducting wire containing Ti and obtained by the prior art internal diffusion method by totally estimating the two in terms of $Jc/d_{\it eff}$, this superconducting wire of the present invention is found to have been improved 7.5 times the prior art superconducting wire.

EXAMPLE 10

Figure 20:
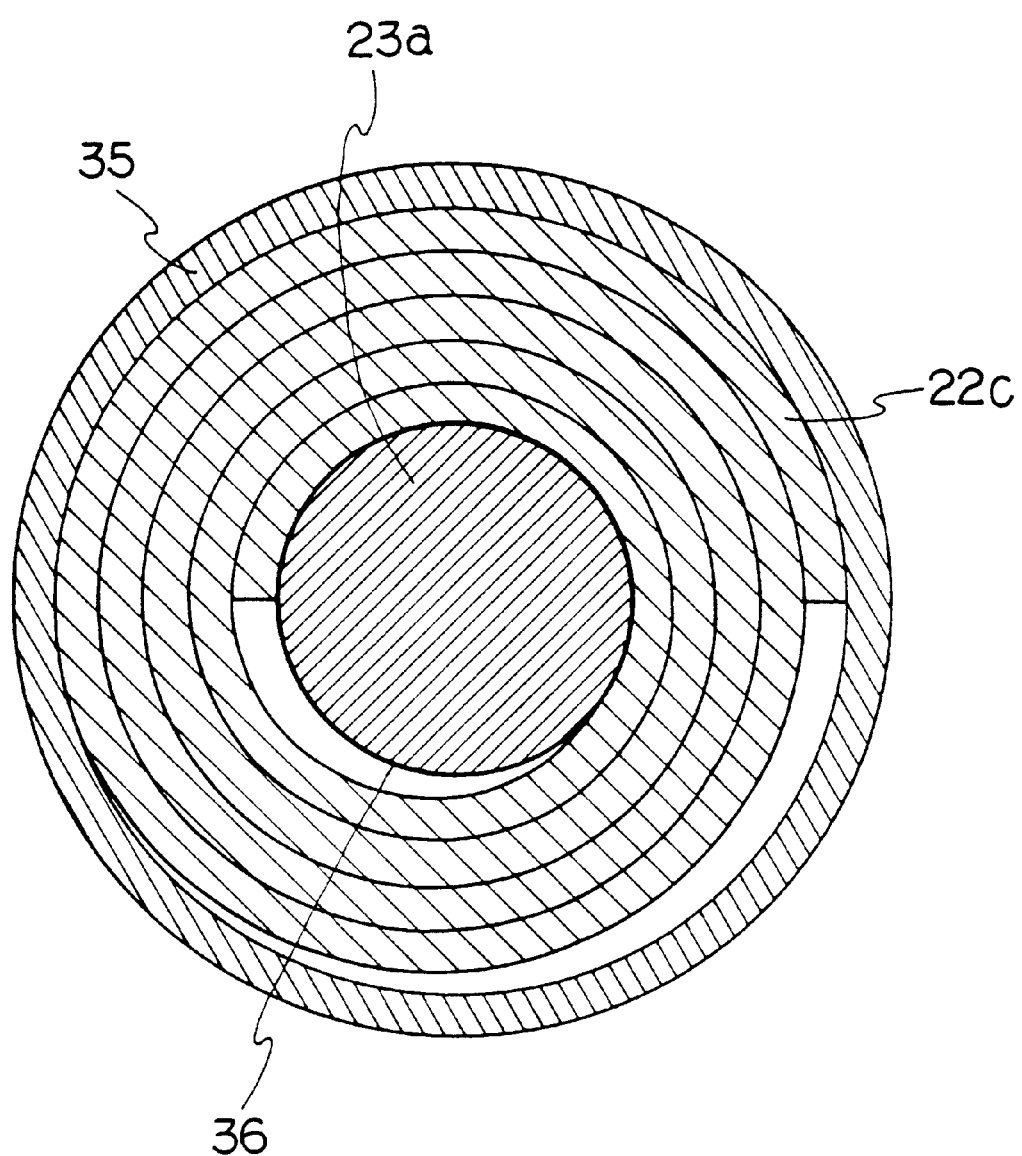
FIG. 20 is an explanatory section view showing another embodiment of a composite single core wire for use in manufacturing a superconducting wire precursor according to the second aspect of the present invention.

FIG. 20 is an explanatory section view showing a constitution of a composite single core wire prior to being reduced in section area for use in manufacturing a superconducting wire according to the second aspect of the present invention. The composite single core wire comprises Cu-Sn composite body 22c composed of a Cu base metal material plated on its both sides with Sn, Nb base metal rod 23a, Cu base metal pipe 35, and Ti thin plate 36 sandwiched between the Cu-Sn composite body 22c and the Nb base metal rod 23a.

Single core wire 1 which becomes a filament of a superconducting wire was formed in the following manner. In the same manner as in Example 9, an oxygen-free copper plate of about 200 mm width and 0.5 mm thickness was plated with Sn in about 0.1 mm thickness to form the Cu-Sn composite body 22c. Ti thin plate 36 of 0.05 mm thickness and about 30 mm width was stacked on the composite body 22c. The composite body 22c with the Ti thin plate 36 was wound about five times around the Nb base metal rod 23a of 10 mm diameter as a core. Since the Ti thin plate 36 was of only about 30 mm width, it was wound around the Nb base metal rod only in a layer. The resultant was then inserted into oxygen-free copper pipe 35 of 18 mm inner diameter and 19 mm outer diameter, followed by being drawn to form a hexagonal composite single core wire of 4.2 mm across section.

A Cu billet similar to that used in Example 6 was stuffed with 1225 pieces of the composite single core wire thus formed, air in the billet was evacuated, and a cover was welded to the billet by electron beam welding. The resultant was then subjected to cold hydrostatic extrusion and drawn to form a composite wire. The composite wire was inserted into a Ta pipe serving as a barrier material against Sn diffusion and further inserted into a Cu pipe for stabilization to achieve secondary composition. The secondary composition thus formed was further drawn to have a final wire diameter and then twisted to form a superconducting wire precursor of 0.3 mm wire diameter.

The thus obtained superconducting wire precursor was subjected to a preheating and then to a heat treatment at 600° to 800° C. for 50 to 200 hours to form a superconducting wire having $Nb_3Sn$ superconductor produced in the Nb base metal filament portion. The sectional structure of the thus obtained superconducting wire was similar to that shown in FIG. 13.

The superconducting wire thus obtained was measured for Jc and $d_{\it eff}$ in liquid helium. The measurement revealed that the Jc value of this supercoducting wire was 900 A/mm² in a magnetic field of B=12T and the $d_{\it eff}$ value was 3 μm. When the superconducting wire thus obtained is compared with an $Nb_3Sn$ superconducting wire containing Ti and obtained by the prior art internal diffusion method by totally estimating the two in terms of $Jc/d_{\it eff}$, this superconducting wire of the present invention is found to have been improved 7.5 times the prior art superconducting wire.

EXAMPLE 11

FIG. 21 is an explanatory view showing a structure of a composite single core wire prior to being reduced in section area for use in manufacturing a superconducting wire according to the second aspect of the present invention. The composite single core wire comprises Cu-Sn composite body 22d plated on its surface with pure Ti, Nb base metal rod 23a, and Cu base metal material pipe 35.

First, in the same manner as in Example 8, a thin plate of 1 mm thickness was formed by rolling to integrate a stack of two Cu plates of 1 mm thickness and an Sn plate of 1 mm thickness sandwiched between the Cu plates. The thin plate was cut to a size of 140 mm×1000 mm and then plated on its one side with a Ti layer of about 10 μm thickness to form the composite body 22d. The composite body 22d was then wound several times around an Nb base metal rod 23a of 10 mm diameter and 1000 mm length in the form of round bar. The resultant was inserted into an oxygen-free copper pipe 35 of 18 mm inner diameter and 19 mm outer diameter, and drawn to form a hexagonal composite single core wire of 4.2 mm across flats.

A Cu billet similar to that used in Example 6 was stuffed with 1225 pieces of the composite single core wire thus formed, air in the billet was evacuated, and a cover was welded to the billet by electron beam welding. This billet was subjected to cold hydrostatic extrusion and then drawn to form a composite wire. The resultant composite wire was inserted into a Ta pipe serving as a barrier material against Sn diffusion, and further inserted into a Cu pipe for stabilization to achieve secondary composition, followed by being drawn to have a final wire diameter. The composite wire of the final diameter was twisted to yield a supercon-ducting wire precursor of 0.3 mm diameter. The sectional structure of the thus obtained superconducting wire precursor was as shown in FIG. 17.

The thus obtained superconducting wire precursor was subjected to a preheating and then to a heat treatment at 600° to 800° C. for 50 to 200 hours to form a superconducting wire having Nb$_3$Sn superconductor produced in the Nb base metal filament portion. The sectional structure of the thus obtained superconducting wire was similar to that shown in FIG. 13.

The superconducting wire thus obtained was measured for Jc and d$_{eff}$ in liquid helium. The measurement revealed that the Jc value of this supercoducting wire was 910 A/mm² in a magnetic field of B=12T and the d$_{eff}$ value was 3 μm. When the superconducting wire thus obtained is compared with an Nb$_3$Sn superconducting wire containing Ti and obtained by the prior art internal diffusion method by totally estimating the two in terms of Jc/d$_{eff}$, this superconducting wire of the present invention is found to have been improved 7.5 times the prior art superconducting wire.

EXAMPLE 12

A superconducting wire may be required to be improved in Jc characteristic rather than in d$_{eff}$ characteristic. To meet this requirement, such an arrangement is offered in this Example that filaments are disposed more tightly than in the foregoing Examples. This arrangement makes it possible to improve Jc characteristic though mutual coupling of the Nb$_3$Sn filaments occurs to some extent after the heat treatment thereby to increase d$_{eff}$ characteristic.

Figure 22:
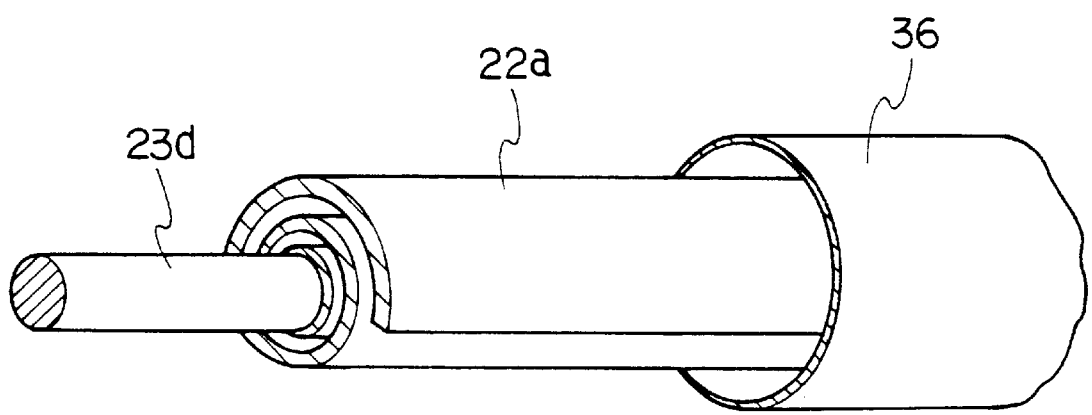
FIG. 22 is an explanatory view showing another embodiment of a composite single core wire for use in manufacturing a superconducting wire precursor according to the second aspect of the present invention.
Figure 23:
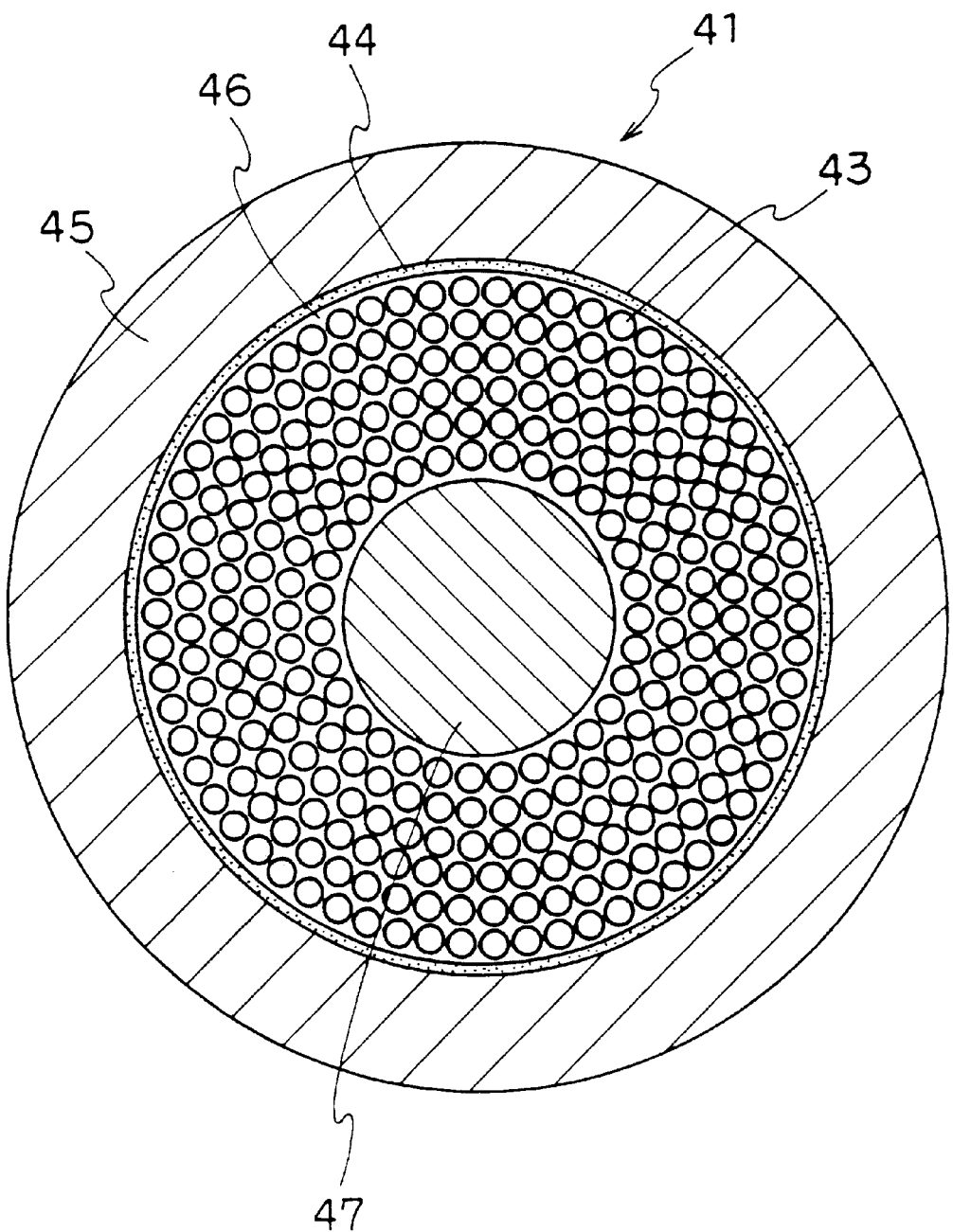
FIG. 23 is an explanatory section view of a conventional superconducting wire precursor.
Figure 24:
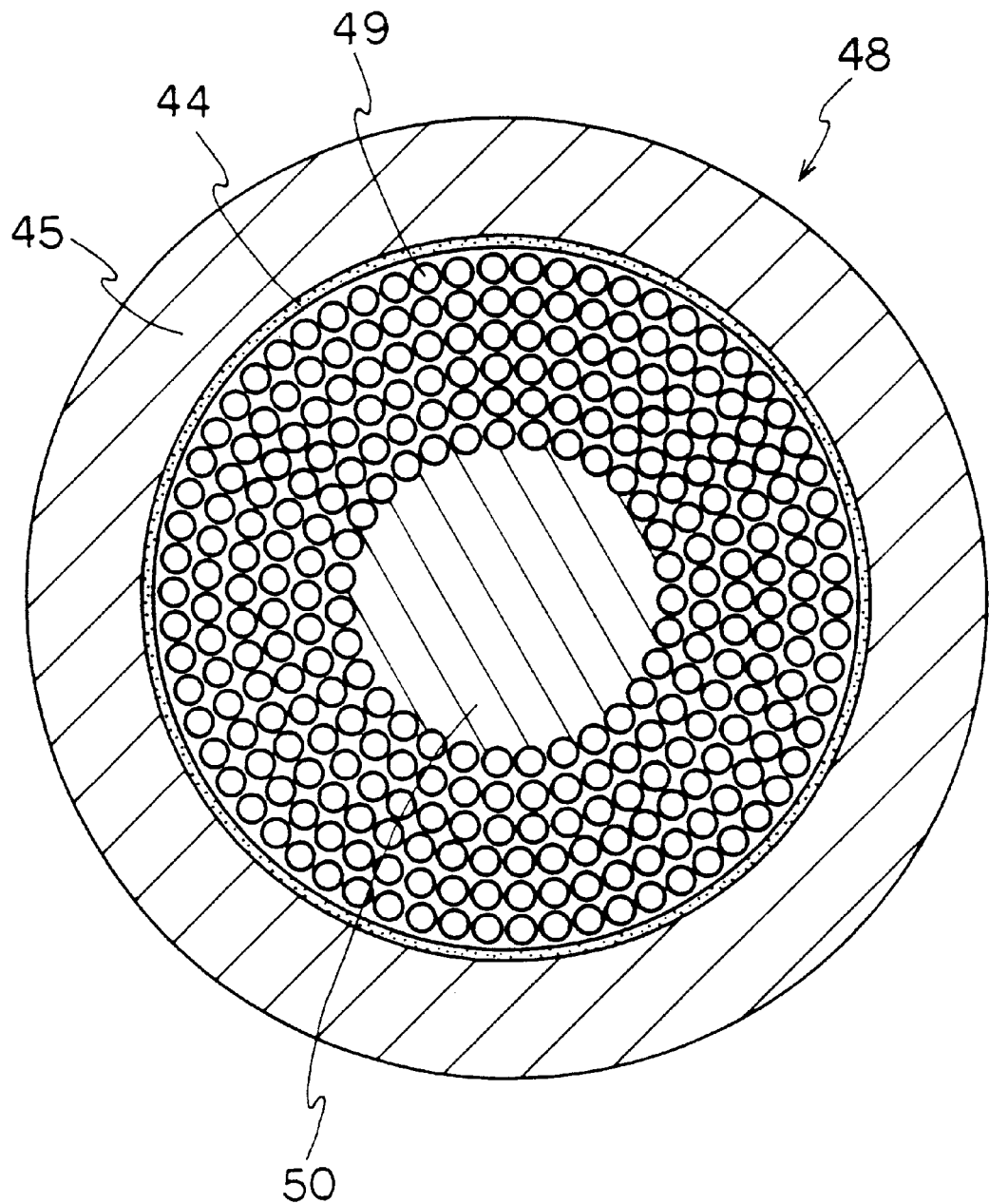
FIG. 24 is an explanatory section view of a conventional superconducting wire.

FIG. 22 is an explanatory view showing a structure of a composite single core wire prior to being reduced in section area for use in manufacturing a superconducting wire according to the second aspect of the present invention. The composite single core wire comprises Cu-Sn composite body 22a, Nb base metal rod 23d containing 1% by weight of Ta, and Cu base metal pipe 36 containing 3% by weight of Ti.

First, in the same manner as in Example 8, a thin plate of 1.5 mm thickness was formed by rolling to integrate a stack of two Cu plates of 1 mm thickness and an Sn plate of 1.5 mm thickness sandwiched between the Cu plates. The thin plate was cut to a size of 150 mm×1000 mm and then wound several times around an Nb base metal round rod 23d of 12.7 mm diameter and 1000 mm length which contained 1% by weight of Ta. The resultant was inserted into the Cu pipe 36 of 19 mm inner diameter and 20 mm outer diameter containing 3% by weight of Ti, followed by being drawn to form a hexagonal composite single core wire of 4.2 mm across flats.

A Cu billet similar to that used in Example 6 was stuffed with 1225 pieces of the single core wire thus formed, air in the billet was evacuated, and a cover was welded to the billet by electron beam welding. This billet was subjected to cold hydrostatic extrusion and then drawn to form a composite wire. The resultant composite wire was inserted into a Ta pipe serving as a barrier material against Sn diffusion, and further inserted into a Cu pipe for stabilization to achieve secondary composition, followed by being drawn to have a final diameter. The composite wire of the final diameter was twisted to yield a superconducting wire precursor of 0.3 mm wire diameter. The sectional structure of the thus obtained superconducting wire precursor was as shown in FIG. 11. The superconducting wire precursor was subjected to a preheating and then to a heat treatment at 600° to 800° C. for 50 to 200 hours to form a superconducting wire having Nb$_3$Sn superconductor in the Nb base metal filament portion. The sectional structure of the thus obtained superconducting wire was similar to that shown in FIG. 13.

The superconducting wire thus obtained was measured for Jc and d$_{eff}$ in liquid helium. The measurement revealed that the Jc value of this superconducting wire was 1250 A/mm² in a magnetic field of B=12T and the n value was 56. When the superconducting wire thus obtained is compared with an Nb$_3$Sn superconducting wire containing Ti and obtained by the prior art internal diffusion method, this superconducting wire of the present invention is found to have been improved in Jc characteristic by about 40% and in n value about twice.

As apparent from the results shown in Examples 1 to 4, it is observed that the superconducting wires prepared by the improved internal diffusion method according to the present invention are improved about four to about seven times in superconducting characteristics estimated in terms of Jc/d$_{eff}$ value as compared with a conventional superconducting wire prepared by the prior art internal diffusion method.

When the superconducting wires obtained by the dispersed Sn diffusion method in Examples 5 to 12 are totally estimated in terms of Jc/d$_{eff}$ value, they are found to have been improved in superconducting characteristics about five to about seven times the superconducting wire obtained by the prior art internal diffusion method. In particular, the superconducting wires prepared in Examples 8 to 12 by a method wherein the Cu-Sn composite body was wound several times around the Nb round bar have remarkably improved superconducting characteristics such as Jc value, d$_{eff}$ value and n value, and further have an excellent processability. This is conceivably because winding the composite body several times around the Nb bar improved the dispersion of Sn and avoided the formation of non-uniform distribution of $Nb_3Sn$ produced in filament, leading to improved superconducting characteristics.

Although the superconducting wires prepared in the foregoing Examples 5 to 12 are those having a stabilizing layer of Cu and a diffusion barrier layer of Ta, it should be understood that use of Al of high purity for the stabilizing layer and Nb or V for the diffusion barrier layer are also effective, and that the provision of the stabilizing layer and diffusion barrier layer may be omitted.

Further, although a multiplicity of single core wires were integrated into a secondary composite to produce a single wire in Examples 1 to 12, a multiplicity of the thus obtained secondary composite wires may be further stuffed in a Cu tube to give a composite and then reduced in section area so as to accommodate heavy current. That is to say, the precursor wire having a structure as shown in FIGS. 1, 9, 12 and the like may be used instead of the single core wire, and a precursor can be prepared using it in a similar manner, whereby a superconducting wire having a heavy current capacity can be obtained.

In addition to the ingredients used in the Examples, other ingredients can be used, for example, by replacing Nb with V and Sn with Ga, as set forth in the specification to obtain substantially the same results.

In the $Nb_3Sn$ superconducting wire according to the first aspect of the present invention, as has been described, the spacing between adjacent Nb base metal filaments is enlarged to such an extent that mutual contact of $Nb_3Sn$ filaments to be produced during the heat treatment will not occur in the region where the boundary of $\epsilon$-phase bronze layer appears during the preheating treatment for diffusing the Sn base metal material. Hence, mutual coupling of $Nb_3Sn$ filaments in the superconducting wire due to mutual contact thereof can be avoided, and further the effective filament diameter of the superconducting wire can be reduced with a decrease in Jc value suppressed to minimum. This results in a substantial reduction in hysteresis loss produced upon conduction of pulse current and leads to a superconducting coil of improved stability.

In the $Nb_3Sn$ superconducting wire precursor according to the second aspect of the present invention, a composite material composed of a base metal material X such as Sn or Ga and Cu is dispersedly disposed around individual filaments of a base metal material Z such as Nb or V, whereby the spacing between adjacent filaments can be increased by about 30% as compared with that according to the prior art internal diffusion method. Hence, the probability of $Nb_3Sn$ filaments or the like coming into mutual contact or coupling in the superconducting wire produced by the heat treatment of the precursor can be remarkably reduced while substantially reducing the value of effective filament diameter. This results in a substantial reduction in hysteresis loss produced upon conduction of pulse current and leads to a superconducting coil of improved stability. Further, since the base metal X such as Sn need not be diffused so far, superconducting compound such as $Nb_3Sn$ is uniformly formed in each filament thereby improving the Jc value and n value. In addition, the time period of the preheating for the diffusion of Sn or the like is shortened thereby contributing to a cost reduction.

What is claimed is:

1. A method for manufacturing an Nb-Sn compound superconducting wire comprising the steps of:

(a) forming a composite body comprising a columnar Cu base metal material, and a plurality of layers of Nb base metal filaments embedded in said Cu base metal material and concentrically arranged around a center portion thereof, wherein said Nb base metal filaments are arranged separately from each other and the spacing between any adjacent Nb base metal filaments existing in a boundary region of an $\epsilon$-phase bronze layer produced when preheated at a temperature of from 300° to 600° C. is larger than that between any adjacent Nb filaments existing in other portions of said Cu base metal material;

(b) forming a through-hole in said center portion of said composite body, and inserting an Sn base metal rod into said through-hole;

(c) drawing the resultant composite body to form a superconducting wire precursor; and (d) heat-treating said precursor.

2. The method of claim 1, wherein the step (a) comprises the steps of:

(a1) forming thick-wall single core wires each comprising an Nb base metal filament covered with a thick wall of a Cu base metal material, and thin-wall single core wires each comprising an Nb base metal filament covered with a thin wall of a Cu base metal material; and (a2) inserting into a Cu container a Cu base metal material rod at the center of said Cu container, said thick-wall single core wires in said boundary region of $\epsilon$-phase bronze layer, and said thin-wall single core wires in both the inside and outside or in only the outside of the annular arrangement of said thick-wall single core wires in said boundary region.

3. The method of claim 1, wherein the step (a) comprises the steps of:

(a3) forming a plurality of apertures in Cu disks such that the spacing between any adjacent ones of the apertures located in a region corresponding to said boundary region of $\epsilon$-phase bronze layer is larger than that between any adjacent ones of the apertures inside and outside said region corresponding to boundary region of $\epsilon$-phase bronze layer;

(a4) inserting into a Cu container said Cu disks in a stacked fashion; and (a5) inserting an Nb base metal rod into each of said plurality of apertures.

4. The method of claim 1, wherein the spacing between any adjacent ones of the Nb base metal filaments in said boundary region of $\epsilon$-phase bronze layer is 0.45 or more times the diameter of any one of the Nb base metal filaments.

5. The method of claim 1, wherein the region in which the spacing between any adjacent Nb base metal filaments is larger than that in the other regions is a region defined between circles having radiuses of 0.7 time and 1.4 times the distance from the center of said precursor to said boundary of $\epsilon$-phase bronze layer produced when said precursor is preheated at 415° C.

6. The method of claim 1, wherein each of said Nb base metal filaments contains 0.01 to 5% by weight of at least one element selected from the group consisting of Ti, Ta, Hf, Mo, Zr and V.

7. The method of claim 1, wherein said Cu base metal material contains 0.01 to 5% by weight of at least one element selected from the group consisting of Ti, In, Ge, Si and Mn.

8. The method of claim 1, wherein said Sn base metal rod contains 0.01 to 10% by weight of at least one element selected from the group consisting of Ti, In, Ga, Ge, Si and Mn.

9. A method for manufacturing a superconducting wire comprising the steps of:

(A) forming a composite rod in which a multiplicity of rods of a second base metal material Z are each embedded in a composite body composed of a Cu base metal material and a first base metal material X, said Cu base metal material and said first base metal material X forming an alloy on heating, wherein said composite body is arranged around each of said rods of a second based metal material Z so as to be interposed between neighboring rods;

(B) drawing the composite rod to form a superconducting wire precursor; and (C) heat-treating the superconducting wire precursor.

10. The method of claim 9, wherein said composite rod is formed by:

(A1) stuffing a Cu container with said composite body composed of said Cu base metal material and said first base metal material X capable of forming an alloy with said Cu base metal material; and (A2) forming apertures in the composite body lengthwise and filling said second base metal material Z into each of the apertures.

11. The method of claim 9, wherein said composite rod is formed by:

(A3) forming composite single core wires in each of which said second base metal material Z is covered with said composite body composed of said Cu base metal material and said first base metal material capable of forming an alloy with said Cu base metal material; and (A4) stuffing a Cu container with the composite single core wires tightly.

12. The method of claim 9, wherein said composite body is one formed by rolling a stacked plate of said Cu base metal material and said first base metal material X to integrate these materials, or one prepared by plating said first base metal material X on at least one side of said Cu base metal material.

13. The method of claim 11, wherein said composite single core wires are each obtained by centrally drilling said Cu base metal material to form an aperture which is in turn refilled with said second base metal material Z, and filling a plurality of apertures provided in said Cu base metal material and existing in the periphery of said second base metal material Z with said first base metal material X.

14. The method of claim 11, wherein said composite single core wires are each obtained by rolling around said second base metal material Z a stacked plate of said Cu base metal material and said first base metal material X or a plate of said Cu base metal material which is plated with said first base metal material X on at least one side thereof.

15. The method of claims 9, wherein said second base metal material Z contains at least one element selected from the group consisting of Ti, Ta, Hf, Mo, Zr and V.

16. The method of claims 10, wherein said second base metal material Z contains at least one element selected from the group consisting of Ti, Ta, Hf, Mo, Zr and V.

17. The method of claims 11, wherein said second base metal material Z contains at least one element selected from the group consisting of Ti, Ta, Hf, Mo, Zr and V.

18. The method of claims 12, wherein said second base metal material Z contains at least one element selected from the group consisting of Ti, Ta, Hf, Mo, Zr and V.

19. The method of claims 13, wherein said second base metal material Z contains at least one element selected from the group consisting of Ti, Ta, Hf, Mo, Zr and V.

20. The method of claims 14, wherein said second base metal material Z contains at least one element selected from the group consisting of Ti, Ta, Hf, Mo, Zr and V.

21. The method of claims 9, wherein said first base metal material X contains at least one element selected from the group consisting of Ti, In, Ge, Si and Mn.

22. The method of claims 10, wherein said first base metal material X contains at least one element selected from the group consisting of Ti, In, Ge, Si and Mn.

23. The method of claims 11, wherein said first base metal material X contains at least one element selected from the group consisting of Ti, In, Ge, Si and Mn.

24. The method of claims 12, wherein said first base metal material X contains at least one element selected from the group consisting of Ti, In, Ge, Si and Mn.

25. The method of claims 13, wherein said first base metal material X contains at least one element selected from the group consisting of Ti, In, Ge, Si and Mn.

26. The method of claims 14, wherein said first base metal material X contains at least one element selected from the group consisting of Ti, In, Ge, Si and Mn.

27. The method of claims 9, wherein said Cu base metal material contains at least one element selected from the group consisting of Ti, In, Ge, Si and Mn.

28. The method of claims 10, wherein said Cu base metal material contains at least one element selected from the group consisting of Ti, In, Ge, Si and Mn.

29. The method of claims 11, wherein said Cu base metal material contains at least one element selected from the group consisting of Ti, In, Ge, Si and Mn.

30. The method of claims 12, wherein said Cu base metal material contains at least one element selected from the group consisting of Ti, In, Ge, Si and Mn.

31. The method of claims 13, wherein said Cu base metal material contains at least one element selected from the group consisting of Ti, In, Ge, Si and Mn.

32. The method of claims 14, wherein said Cu base metal material contains at least one element selected from the group consisting of Ti, In, Ge, Si and Mn.

* * * * *